United States Patent
Khlat

(10) Patent No.: US 11,716,057 B2
(45) Date of Patent: Aug. 1, 2023

(54) ENVELOPE TRACKING CIRCUITRY

(71) Applicant: Qorvo US, Inc., Greensboro, NC (US)

(72) Inventor: Nadim Khlat, Cugnaux (FR)

(73) Assignee: Qorvo US, Inc., Greensboro, NC (US)

( * ) Notice: Subject to any disclaimer, the term of this patent is extended or adjusted under 35 U.S.C. 154(b) by 33 days.

(21) Appl. No.: 17/146,765

(22) Filed: Jan. 12, 2021

(65) Prior Publication Data

US 2021/0234513 A1 Jul. 29, 2021

Related U.S. Application Data

(60) Provisional application No. 62/966,574, filed on Jan. 28, 2020.

(51) Int. Cl.
*H03F 3/04* (2006.01)
*H03F 1/02* (2006.01)
*H03F 3/21* (2006.01)

(52) U.S. Cl.
CPC .......... *H03F 1/0233* (2013.01); *H03F 3/21* (2013.01); *H03F 1/0244* (2013.01); *H03F 2200/105* (2013.01); *H03F 2200/451* (2013.01)

(58) Field of Classification Search
CPC .... H03F 1/0233; H03F 3/21; H03F 2200/105; H03F 2200/451; H03F 2200/435;

(Continued)

(56) References Cited

U.S. PATENT DOCUMENTS 5,510,753 A  4/1996 French
5,838,732 A  11/1998 Carney
(Continued)

FOREIGN PATENT DOCUMENTS

CN  103916093 A  7/2014
CN  105322894 A  2/2016
(Continued)

OTHER PUBLICATIONS

Notice of Allowance for U.S. Appl. No. 15/984,566, dated Mar. 18, 2019, 7 pages.
(Continued)

*Primary Examiner* — Khanh V Nguyen
(74) *Attorney, Agent, or Firm* — Withrow & Terranova, P.L.L.C.

(57) ABSTRACT

Disclosed is envelope tracking circuitry having an envelope tracking integrated circuit (ETIC) coupled to a power supply to provide an envelope tracked power signal to a power amplifier (PA) with a filter equalizer configured to inject an error-correcting signal into the ETIC in response to equalizer settings. Further included is PA resistance estimator circuitry having a first peak detector circuit configured to capture within a window first peaks associated with a sense current generated by the ETIC, a second peak detector circuit configured to capture within the window second peaks associated with a scaled supply voltage corresponding to the envelope tracked power signal, comparator circuitry configured to receive the first peaks and receive the second peaks and generate an estimation of PA resistance, and an equalizer settings correction circuit configured to receive the estimation of PA resistance and update the equalizer settings in response to the estimation of PA resistance.

20 Claims, 17 Drawing Sheets

(58) Field of Classification Search
CPC .... H03F 3/245; H03F 3/195; H03F 2200/102;
H03F 1/0244; H03F 1/0211; H03F 2200/504; H03F 3/04
USPC ........................................................ 330/297
See application file for complete search history.

(56) References Cited

U.S. PATENT DOCUMENTS

| | | | |
|---|---|---|---|
| 6,107,862 | A | 8/2000 | Mukainakano et al. |
| 6,141,377 | A | 10/2000 | Sharper et al. |
| 6,141,541 | A | 10/2000 | Midya et al. |
| 6,411,531 | B1 | 6/2002 | Nork et al. |
| 6,985,033 | B1 | 1/2006 | Shirali et al. |
| 7,043,213 | B2 | 5/2006 | Robinson et al. |
| 7,471,155 | B1 | 12/2008 | Levesque |
| 7,570,931 | B2 | 8/2009 | McCallister et al. |
| 7,994,862 | B1 | 8/2011 | Pukhovski |
| 8,461,928 | B2 | 6/2013 | Yahav et al. |
| 8,493,141 | B2 | 7/2013 | Khlat et al. |
| 8,519,788 | B2 | 8/2013 | Khlat |
| 8,588,713 | B2 | 11/2013 | Khlat |
| 8,718,188 | B2 | 5/2014 | Balteanu et al. |
| 8,723,492 | B2 | 5/2014 | Korzeniowski |
| 8,725,218 | B2 | 5/2014 | Brown et al. |
| 8,774,065 | B2 | 7/2014 | Khlat et al. |
| 8,803,603 | B2 | 8/2014 | Wimpenny |
| 8,818,305 | B1 | 8/2014 | Schwent et al. |
| 8,854,129 | B2 | 10/2014 | Wilson |
| 8,879,665 | B2 | 11/2014 | Xia et al. |
| 8,913,690 | B2 | 12/2014 | Onishi |
| 8,942,651 | B2 | 1/2015 | Jones |
| 8,947,161 | B2 | 2/2015 | Khlat et al. |
| 8,989,682 | B2 | 3/2015 | Ripley et al. |
| 9,018,921 | B2 | 4/2015 | Gurlahosur |
| 9,020,451 | B2 | 4/2015 | Khlat |
| 9,041,364 | B2 | 5/2015 | Khlat |
| 9,041,365 | B2 | 5/2015 | Kay et al. |
| 9,055,529 | B2 | 6/2015 | Shih |
| 9,065,509 | B1 | 6/2015 | Yan et al. |
| 9,069,365 | B2 | 6/2015 | Brown et al. |
| 9,098,099 | B2 | 8/2015 | Park et al. |
| 9,166,538 | B2 | 10/2015 | Hong et al. |
| 9,166,830 | B2 | 10/2015 | Camuffo et al. |
| 9,167,514 | B2 | 10/2015 | Dakshinamurthy et al. |
| 9,197,182 | B2 | 11/2015 | Baxter et al. |
| 9,225,362 | B2 | 12/2015 | Drogi et al. |
| 9,247,496 | B2 | 1/2016 | Khlat |
| 9,263,997 | B2 | 2/2016 | Vinayak |
| 9,270,230 | B2 | 2/2016 | Henshaw et al. |
| 9,270,239 | B2 | 2/2016 | Drogi et al. |
| 9,271,236 | B2 | 2/2016 | Drogi |
| 9,280,163 | B2 | 3/2016 | Kay et al. |
| 9,288,098 | B2 | 3/2016 | Yan et al. |
| 9,298,198 | B2 | 3/2016 | Kay et al. |
| 9,344,304 | B1 | 5/2016 | Cohen |
| 9,356,512 | B2 | 5/2016 | Chowdhury et al. |
| 9,362,868 | B2 * | 6/2016 | Al-Qaq ............... H03F 3/24 |
| 9,377,797 | B2 | 6/2016 | Kay et al. |
| 9,379,667 | B2 | 6/2016 | Khlat et al. |
| 9,445,371 | B2 | 9/2016 | Khesbak et al. |
| 9,515,622 | B2 | 12/2016 | Nentwig et al. |
| 9,520,907 | B2 | 12/2016 | Peng et al. |
| 9,584,071 | B2 | 2/2017 | Khlat |
| 9,595,869 | B2 | 3/2017 | Lerdworatawee |
| 9,595,981 | B2 | 3/2017 | Khlat |
| 9,596,110 | B2 | 3/2017 | Jiang et al. |
| 9,614,477 | B1 | 4/2017 | Rozenblit et al. |
| 9,634,666 | B2 | 4/2017 | Krug |
| 9,748,845 | B1 | 8/2017 | Kotikalapoodi |
| 9,806,676 | B2 | 10/2017 | Balteanu et al. |
| 9,831,834 | B2 | 11/2017 | Balteanu et al. |
| 9,837,962 | B2 | 12/2017 | Mathe et al. |
| 9,900,204 | B2 | 2/2018 | Levesque et al. |
| 9,923,520 | B1 | 3/2018 | Abdelfattah et al. |
| 10,003,416 | B1 | 6/2018 | Lloyd |
| 10,090,808 | B1 | 10/2018 | Henzler et al. |
| 10,090,809 | B1 | 10/2018 | Khlat |
| 10,097,145 | B1 | 10/2018 | Khlat et al. |
| 10,103,693 | B2 | 10/2018 | Zhu et al. |
| 10,110,169 | B2 | 10/2018 | Khesbak et al. |
| 10,158,329 | B1 | 12/2018 | Khlat |
| 10,158,330 | B1 | 12/2018 | Khlat |
| 10,170,989 | B2 | 1/2019 | Balteanu et al. |
| 10,291,181 | B2 | 5/2019 | Kim et al. |
| 10,326,408 | B2 | 6/2019 | Khlat et al. |
| 10,361,744 | B1 * | 7/2019 | Khlat ............... H04B 1/0475 |
| 10,382,071 | B2 | 8/2019 | Rozek et al. |
| 10,476,437 | B2 | 11/2019 | Nag et al. |
| 10,756,675 | B2 | 8/2020 | Leipold et al. |
| 10,862,431 | B1 | 12/2020 | Khlat |
| 10,879,804 | B2 | 12/2020 | Kim et al. |
| 11,050,433 | B1 | 6/2021 | Melanson et al. |
| 11,121,684 | B2 | 9/2021 | Henzler et al. |
| 11,128,261 | B2 | 9/2021 | Ranta et al. |
| 2002/0167827 | A1 | 11/2002 | Umeda et al. |
| 2003/0107428 | A1 | 6/2003 | Khouri et al. |
| 2004/0266366 | A1 | 12/2004 | Robinson et al. |
| 2005/0090209 | A1 | 4/2005 | Behzad |
| 2005/0227646 | A1 | 10/2005 | Yamazaki et al. |
| 2005/0232385 | A1 | 10/2005 | Yoshikawa et al. |
| 2006/0028271 | A1 | 2/2006 | Wilson |
| 2006/0240786 | A1 | 10/2006 | Liu |
| 2007/0052474 | A1 | 3/2007 | Saito |
| 2007/0258602 | A1 | 11/2007 | Vepsalainen et al. |
| 2007/0290748 | A1 | 12/2007 | Woo et al. |
| 2008/0116960 | A1 | 5/2008 | Nakamura |
| 2008/0231358 | A1 | 9/2008 | Maemura |
| 2009/0016085 | A1 | 1/2009 | Rader et al. |
| 2009/0045872 | A1 | 2/2009 | Kenington |
| 2009/0191826 | A1 | 7/2009 | Takinami et al. |
| 2010/0283534 | A1 | 11/2010 | Pierdomenico |
| 2010/0308919 | A1 | 12/2010 | Adamski et al. |
| 2011/0074373 | A1 | 3/2011 | Lin |
| 2011/0136452 | A1 | 6/2011 | Pratt et al. |
| 2011/0175681 | A1 | 7/2011 | Inamori et al. |
| 2011/0279179 | A1 | 11/2011 | Vice |
| 2012/0194274 | A1 | 8/2012 | Fowers et al. |
| 2012/0200435 | A1 | 8/2012 | Ngo et al. |
| 2012/0281597 | A1 | 11/2012 | Khlat et al. |
| 2012/0299645 | A1 | 11/2012 | Southcombe et al. |
| 2012/0299647 | A1 | 11/2012 | Honjo et al. |
| 2013/0021827 | A1 | 1/2013 | Ye |
| 2013/0100991 | A1 | 4/2013 | Woo |
| 2013/0127548 | A1 | 5/2013 | Popplewell et al. |
| 2013/0130724 | A1 | 5/2013 | Kumar Reddy et al. |
| 2013/0141064 | A1 | 6/2013 | Kay et al. |
| 2013/0162233 | A1 | 6/2013 | Marty |
| 2013/0187711 | A1 | 7/2013 | Goedken et al. |
| 2013/0200865 | A1 | 8/2013 | Wimpenny |
| 2013/0271221 | A1 | 10/2013 | Levesque et al. |
| 2014/0009226 | A1 | 1/2014 | Severson |
| 2014/0028370 | A1 | 1/2014 | Wimpenny |
| 2014/0028390 | A1 | 1/2014 | Davis |
| 2014/0055197 | A1 | 2/2014 | Khlat et al. |
| 2014/0057684 | A1 | 2/2014 | Khlat |
| 2014/0103995 | A1 | 4/2014 | Langer |
| 2014/0155002 | A1 | 6/2014 | Dakshinamurthy et al. |
| 2014/0169427 | A1 | 6/2014 | Asenio et al. |
| 2014/0184335 | A1 | 7/2014 | Nobbe et al. |
| 2014/0199949 | A1 | 7/2014 | Nagode et al. |
| 2014/0203869 | A1 | 7/2014 | Khlat et al. |
| 2014/0210550 | A1 | 7/2014 | Mathe et al. |
| 2014/0213196 | A1 | 7/2014 | Langer et al. |
| 2014/0218109 | A1 | 8/2014 | Wimpenny |
| 2014/0235185 | A1 | 8/2014 | Drogi |
| 2014/0266423 | A1 | 9/2014 | Drogi et al. |
| 2014/0266428 | A1 | 9/2014 | Chiron et al. |
| 2014/0315504 | A1 | 10/2014 | Sakai et al. |
| 2014/0361830 | A1 | 12/2014 | Mathe et al. |
| 2014/0361837 | A1 | 12/2014 | Strange et al. |
| 2015/0048883 | A1 | 2/2015 | Vinayak |
| 2015/0071382 | A1 | 3/2015 | Wu et al. |
| 2015/0098523 | A1 | 4/2015 | Lim et al. |
| 2015/0139358 | A1 | 5/2015 | Asuri et al. |

(56) References Cited

U.S. PATENT DOCUMENTS

| | | |
|---|---|---|
| 2015/0155836 A1 | 6/2015 | Midya et al. |
| 2015/0188432 A1 | 7/2015 | Vannorsdel et al. |
| 2015/0234402 A1 | 8/2015 | Kay et al. |
| 2015/0236652 A1 | 8/2015 | Yang et al. |
| 2015/0236654 A1 | 8/2015 | Jiang et al. |
| 2015/0236729 A1 | 8/2015 | Peng et al. |
| 2015/0236877 A1 | 8/2015 | Peng et al. |
| 2015/0280652 A1 | 10/2015 | Cohen |
| 2015/0333781 A1 | 11/2015 | Alon et al. |
| 2016/0050629 A1 | 2/2016 | Khesbak et al. |
| 2016/0065137 A1 | 3/2016 | Khlat |
| 2016/0065139 A1 | 3/2016 | Lee et al. |
| 2016/0099686 A1 | 4/2016 | Perreault et al. |
| 2016/0099687 A1 | 4/2016 | Khlat |
| 2016/0105151 A1 | 4/2016 | Langer |
| 2016/0118941 A1 | 4/2016 | Wang |
| 2016/0126900 A1 | 5/2016 | Shute |
| 2016/0164550 A1 | 6/2016 | Pilgram |
| 2016/0164551 A1 | 6/2016 | Khlat et al. |
| 2016/0173031 A1 | 6/2016 | Langer |
| 2016/0181995 A1 | 6/2016 | Nentwig et al. |
| 2016/0187627 A1 | 6/2016 | Abe |
| 2016/0197627 A1 | 7/2016 | Qin et al. |
| 2016/0226448 A1 | 8/2016 | Wimpenny |
| 2016/0249300 A1 | 8/2016 | Tsai et al. |
| 2016/0294587 A1 | 10/2016 | Jiang et al. |
| 2017/0005619 A1 | 1/2017 | Khlat |
| 2017/0012675 A1 | 1/2017 | Frederick |
| 2017/0141736 A1 | 5/2017 | Pratt et al. |
| 2017/0302183 A1 | 10/2017 | Young |
| 2017/0317913 A1 | 11/2017 | Kim et al. |
| 2017/0338773 A1 | 11/2017 | Balteanu et al. |
| 2018/0013465 A1 | 1/2018 | Chiron et al. |
| 2018/0048265 A1 | 2/2018 | Nentwig |
| 2018/0048276 A1 | 2/2018 | Khlat et al. |
| 2018/0076772 A1 | 3/2018 | Khesbak et al. |
| 2018/0123453 A1 | 5/2018 | Puggelli et al. |
| 2018/0152144 A1 | 5/2018 | Choo et al. |
| 2018/0254530 A1 | 9/2018 | Wigney |
| 2018/0288697 A1 | 10/2018 | Camuffo et al. |
| 2018/0302042 A1 | 10/2018 | Zhang et al. |
| 2018/0309414 A1 | 10/2018 | Khlat et al. |
| 2018/0367101 A1 | 12/2018 | Chen et al. |
| 2018/0375476 A1 | 12/2018 | Balteanu et al. |
| 2018/0375483 A1 | 12/2018 | Balteanu et al. |
| 2019/0028060 A1 | 1/2019 | Jo et al. |
| 2019/0044480 A1 | 2/2019 | Khlat |
| 2019/0068234 A1 | 2/2019 | Khlat et al. |
| 2019/0097277 A1 | 3/2019 | Fukae |
| 2019/0109566 A1 | 4/2019 | Folkmann et al. |
| 2019/0109613 A1 | 4/2019 | Khlat et al. |
| 2019/0181804 A1 | 6/2019 | Khlat |
| 2019/0222178 A1 | 7/2019 | Khlat et al. |
| 2019/0229623 A1 | 7/2019 | Tsuda et al. |
| 2019/0238095 A1 | 8/2019 | Khlat |
| 2019/0253023 A1 | 8/2019 | Yang et al. |
| 2019/0267956 A1 | 8/2019 | Granger-Jones et al. |
| 2019/0222175 A1 | 10/2019 | Khlat et al. |
| 2019/0319584 A1 | 10/2019 | Khlat et al. |
| 2019/0386565 A1 | 12/2019 | Rosolowski et al. |
| 2020/0007090 A1 | 1/2020 | Khlat et al. |
| 2020/0036337 A1 | 1/2020 | Khlat |
| 2020/0106392 A1 | 4/2020 | Khlat et al. |
| 2020/0127608 A1 | 4/2020 | Khlat |
| 2020/0127625 A1 | 4/2020 | Khlat |
| 2020/0136561 A1 | 4/2020 | Khlat et al. |
| 2020/0136563 A1 | 4/2020 | Khlat |
| 2020/0136575 A1 | 4/2020 | Khlat et al. |
| 2020/0144966 A1 | 5/2020 | Khlat |
| 2020/0153394 A1 | 5/2020 | Khlat et al. |
| 2020/0177131 A1 | 6/2020 | Khlat |
| 2020/0204116 A1 | 6/2020 | Khlat |
| 2020/0228063 A1 | 7/2020 | Khlat |
| 2020/0259456 A1 | 8/2020 | Khlat |
| 2020/0259685 A1 | 8/2020 | Khlat |
| 2020/0266766 A1 | 8/2020 | Khlat et al. |
| 2020/0313622 A1 | 10/2020 | Eichler et al. |
| 2020/0321848 A1 | 10/2020 | Khlat |
| 2020/0321917 A1 | 10/2020 | Nomiyama et al. |
| 2020/0328720 A1 | 10/2020 | Khlat |
| 2020/0336105 A1 | 10/2020 | Khlat |
| 2020/0336111 A1 | 10/2020 | Khlat |
| 2020/0350865 A1 | 11/2020 | Khlat |
| 2020/0382061 A1 | 12/2020 | Khlat |
| 2020/0382066 A1 | 12/2020 | Khlat |
| 2021/0036604 A1 | 2/2021 | Khlat et al. |
| 2021/0159590 A1 | 5/2021 | Na et al. |
| 2021/0175896 A1 | 6/2021 | Melanson et al. |
| 2021/0184708 A1 | 6/2021 | Khlat |
| 2021/0194515 A1 | 6/2021 | Go et al. |
| 2021/0194517 A1 | 6/2021 | Mirea et al. |
| 2021/0194522 A1 | 6/2021 | Stockert et al. |
| 2021/0211108 A1 | 7/2021 | Khlat |
| 2021/0226585 A1 | 7/2021 | Khlat |
| 2021/0281228 A1 | 9/2021 | Khlat |
| 2021/0288615 A1 | 9/2021 | Khlat |
| 2021/0305944 A1 | 9/2021 | Scott et al. |

FOREIGN PATENT DOCUMENTS

| | | |
|---|---|---|
| CN | 105680807 A | 6/2016 |
| CN | 106208974 A | 12/2016 |
| CN | 106209270 A | 12/2016 |
| CN | 106877824 A | 6/2017 |
| CN | 107093987 A | 8/2017 |
| EP | 3174199 A2 | 5/2012 |
| JP | H03104422 A | 5/1991 |
| WO | 2018182778 A1 | 10/2018 |
| WO | 2020206246 A1 | 10/2020 |
| WO | 2021016350 A1 | 1/2021 |
| WO | 2021046453 A1 | 3/2021 |

OTHER PUBLICATIONS

Non-Final Office Action for U.S. Appl. No. 16/263,316, dated Dec. 23, 2019, 10 pages.
Final Office Action for U.S. Appl. No. 16/263,316, dated May 13, 2020, 10 pages.
Non-Final Office Action for U.S. Appl. No. 16/263,316, dated Jul. 17, 2020, 4 pages.
Non-Final Office Action for U.S. Appl. No. 16/263,316, dated Nov. 24, 2020, 4 pages.
Notice of Allowance for U.S. Appl. No. 16/263,316, dated Mar. 30, 2021, 7 pages.
Final Office Action for U.S. Appl. No. 16/807,575, dated May 4, 2022, 12 pages.
Quayle Action for U.S. Appl. No. 16/855,154, dated Oct. 25, 2021, 6 pages.
Advisory Action for U.S. Appl. No. 16/807,575, dated Jul. 28, 2022, 3 pages.
Notice of Allowance for U.S. Appl. No. 16/807,575, dated Aug. 19, 2022, 8 pages.
Notice of Allowance for U.S. Appl. No. 17/148,064, dated Aug. 18, 2022, 8 pages.
Non-Final Office Action for U.S. Appl. No. 17/163,642, dated Aug. 17, 2022, 9 pages.
Final Office Action for U.S. Appl. No. 17/032,553, dated Jul. 29, 2022, 6 pages.
Final Office Action for U.S. Appl. No. 17/073,764, dated Jun. 1, 2022, 22 pages.
Advisory Action for U.S. Appl. No. 17/073,764, dated Aug. 23, 2022, 3 pages.
Extended European Search Report for European Patent Application No. 22153526.3, dated Jul. 13, 2022, 9 pages.
Non-Final Office Action for U.S. Appl. No. 14/836,634, dated May 16, 2016, 9 pages.
Non-Final Office Action for U.S. Appl. No. 14/868,890, dated Jul. 14, 2016, 13 pages.
Non-Final Office Action for U.S. Appl. No. 15/792,909, dated May 18, 2018, 13 pages.

(56) References Cited

OTHER PUBLICATIONS

Notice of Allowance for U.S. Appl. No. 15/459,449, dated Mar. 28, 2018, 7 pages.
Notice of Allowance for U.S. Appl. No. 15/723,460, dated Jul. 24, 2018, 8 pages.
Notice of Allowance for U.S. Appl. No. 15/704,131, dated Jul. 17, 2018, 7 pages.
Notice of Allowance for U.S. Appl. No. 15/728,202, dated Aug. 2, 2018, 7 pages.
Non-Final Office Action for U.S. Appl. No. 15/888,300, dated Aug. 28, 2018, 11 pages.
Notice of Allowance for U.S. Appl. No. 15/792,909, dated Dec. 19, 2018, 11 pages.
Notice of Allowance for U.S. Appl. No. 15/993,705, dated Oct. 31, 2018, 7 pages.
Pfister, Henry, "Discrete-Time Signal Processing," Lecture Note, pfister.ee.duke.edu/courses/ece485/dtsp.pdf, Mar. 3, 2017, 22 pages.
Non-Final Office Action for U.S. Appl. No. 15/888,260, dated May 2, 2019, 14 pages.
Non-Final Office Action for U.S. Appl. No. 15/986,948, dated Mar. 28, 2019, 8 pages.
Non-Final Office Action for U.S. Appl. No. 16/018,426, dated Apr. 11, 2019, 11 pages.
Supplemental Notice of Allowability for U.S. Appl. No. 15/902,244, dated Mar. 20, 2019, 6 pages.
Notice of Allowance for U.S. Appl. No. 15/902,244, dated Feb. 8, 2019, 8 pages.
Advisory Action for U.S. Appl. No. 15/888,300, dated Jun. 5, 2019, 3 pages.
Notice of Allowance for U.S. Appl. No. 15/984,566, dated May 21, 2019, 6 pages.
Notice of Allowance for U.S. Appl. No. 16/150,556, dated Jul. 29, 2019, 7 pages.
Non-Final Office Action for U.S. Appl. No. 15/888,300, dated Jun. 27, 2019, 17 pages.
Final Office Action for U.S. Appl. No. 15/986,948, dated Aug. 27, 2019, 9 pages.
Advisory Action for U.S. Appl. No. 15/986,948, dated Nov. 8, 2019, 3 pages.
Notice of Allowance for U.S. Appl. No. 15/986,948, dated Dec. 13, 2019, 7 pages.
Final Office Action for U.S. Appl. No. 16/018,426, dated Sep. 4, 2019, 12 pages.
Advisory Action for U.S. Appl. No. 16/018,426, dated Nov. 19, 2019, 3 pages.
Notice of Allowance for U.S. Appl. No. 16/180,887, dated Jan. 13, 2020, 8 pages.
Notice of Allowance for U.S. Appl. No. 15/888,300, dated Jan. 14, 2020, 11 pages.
Non-Final Office Action for U.S. Appl. No. 16/122,611, dated Mar. 11, 2020, 16 pages.
Corrected Notice of Allowability for U.S. Appl. No. 15/888,300, dated Feb. 25, 2020, 7 pages.
Notice of Allowance for U.S. Appl. No. 16/018,426, dated Mar. 31, 2020, 7 pages.
Non-Final Office Action for U.S. Appl. No. 16/174,535, dated Feb. 4, 2020, 7 pages.
Quayle Action for U.S. Appl. No. 16/354,234, dated Mar. 6, 2020, 8 pages.
Notice of Allowance for U.S. Appl. No. 16/354,234, dated Apr. 24, 2020, 9 pages.
Non-Final Office Action for U.S. Appl. No. 16/246,859, dated Apr. 28, 2020, 9 pages.
Corrected Notice of Allowability for U.S. Appl. No. 15/888,300, dated May 13, 2020, 7 pages.
Notice of Allowance for U.S. Appl. No. 16/155,127, dated Jun. 1, 2020, 8 pages.
Final Office Action for U.S. Appl. No. 16/174,535, dated Jul. 1, 2020, 7 pages.
Non-Final Office Action for U.S. Appl. No. 16/284,023, dated Jun. 24, 2020, 7 pages.
Non-Final Office Action for U.S. Appl. No. 16/435,940, dated Jul. 23, 2020, 6 pages.
Final Office Action for U.S. Appl. No. 15/888,300, dated Feb. 15, 2019, 15 pages.
Final Office Action for U.S. Appl. No. 16/122,611, dated Sep. 18, 2020, 17 pages.
Advisory Action for U.S. Appl. No. 16/174,535, dated Sep. 24, 2020, 3 pages.
Notice of Allowance for U.S. Appl. No. 16/174,535, dated Oct. 29, 2020, 7 pages.
Notice of Allowance for U.S. Appl. No. 16/246,859, dated Sep. 18, 2020, 8 pages.
Final Office Action for U.S. Appl. No. 16/284,023, dated Nov. 3, 2020, 7 pages.
Quayle Action for U.S. Appl. No. 16/421,905, dated Aug. 25, 2020, 5 pages.
Non-Final Office Action for U.S. Appl. No. 16/416,812, dated Oct. 16, 2020, 8 pages.
Non-Final Office Action for U.S. Appl. No. 16/514,051, dated Nov. 13, 2020, 9 pages.
Non-Final Office Action for U.S. Appl. No. 16/774,060, dated Aug. 17, 2020, 6 pages.
Notice of Allowance for U.S. Appl. No. 16/122,611, dated Dec. 1, 2020, 9 pages.
Notice of Allowance for U.S. Appl. No. 16/689,236 dated Jun. 9, 2021, 7 pages.
Non-Final Office Action for U.S. Appl. No. 16/775,554, dated Jun. 14, 2021, 5 pages.
Non-Final Office Action for U.S. Appl. No. 16/597,952, dated May 26, 2021, 7 pages.
Wan, F. et al., "Negative Group Delay Theory of a Four-Port RC-Network Feedback Operational Amplifier," IEEE Access, vol. 7, Jun. 13, 2019, IEEE, 13 pages.
Notice of Allowance for U.S. Appl. No. 16/582,471, dated Jun. 22, 2021, 9 pages.
Notice of Allowance for U.S. Appl. No. 16/834,049, dated Jun. 24, 2021, 8 pages.
Quayle Action for U.S. Appl. No. 16/589,940, dated Dec. 4, 2020, 8 pages.
Notice of Allowance for U.S. Appl. No. 16/122,611, dated Jan. 13, 2021, 8 pages.
Notice of Allowance for U.S. Appl. No. 16/284,023, dated Jan. 19, 2021, 7 pages.
Notice of Allowance for U.S. Appl. No. 16/416,812, dated Feb. 16, 2021, 8 pages.
Non-Final Office Action for U.S. Appl. No. 16/689,236 dated Mar. 2, 2021, 15 pages.
Notice of Allowance for U.S. Appl. No. 16/435,940, dated Dec. 21, 2020, 7 pages.
Notice of Allowance for U.S. Appl. No. 16/774,060, dated Feb. 3, 2021, 7 pages.
Notice of Allowance for U.S. Appl. No. 16/590,790, dated Jan. 27, 2021, 7 pages.
Notice of Allowance for U.S. Appl. No. 16/661,061, dated Feb. 10, 2021, 7 pages.
Notice of Allowance for U.S. Appl. No. 16/122,611, dated Apr. 1, 2021, 8 pages.
Non-Final Office Action for U.S. Appl. No. 16/582,471, dated Mar. 24, 2021, 11 pages.
U.S. Appl. No. 17/126,561, filed Dec. 18, 2020.
U.S. Appl. No. 17/148,064, filed Jan. 13, 2021.
Notice of Allowance for U.S. Appl. No. 16/582,471, dated Feb. 1, 2022, 9 pages.
Non-Final Office Action for U.S. Appl. No. 16/807,575, dated Jan. 31, 2022, 12 pages.
International Search Report and Written Opinion for International Patent Application No. PCT/US2021/050892, dated Jan. 5, 2022, 20 pages.
International Search Report and Written Opinion for International Patent Application No. PCT/US2021/052151, dated Jan. 4, 2022, 16 pages.

(56) References Cited

OTHER PUBLICATIONS

International Search Report and Written Opinion for International Patent Application No. PCT/US2021/054141 dated Jan. 25, 2022, 15 pages.
Non-Final Office Action for U.S. Appl. No. 17/032,553, dated Mar. 21, 2022, 4 pages.
International Search Report and Written Opinion for International Patent Application No. PCT/US2021/052830, dated Jan. 24, 2022, 13 pages.
Notice of Allowance for U.S. Appl. No. 15/964,762, dated Mar. 18, 2019, 7 pages.
International Preliminary Report on Patentability for International Patent Application No. PCT/US2021/052151, dated Oct. 13, 2022, 21 pages.
International Preliminary Report on Patentability for International Patent Application No. PCT/US2021/054141, dated Sep. 29, 2022, 20 pages.
Final Office Action for U.S. Appl. No. 17/163,642, dated Nov. 25, 2022, 13 pages.
Notice of Allowance for U.S. Appl. No. 17/032,553, dated Oct. 11, 2022, 7 pages.
Non-Final Office Action for U.S. Appl. No. 17/073,764, dated Sep. 30, 2022, 13 pages.
Written Opinion for International Patent Application No. PCT/US2021/052830, dated Nov. 3, 2022, 7 pages.
Chen, S. et al., "A 4.5 μW 2.4 GHz Wake-Up Receiver Based on Complementary Current-Reuse RF Detector," 2015 IEEE International Symposium on Circuits and Systems (ISCAS), May 24-27, 2015, IEEE, pp. 1214-1217.
Ying, K. et al., "A Wideband Envelope Detector with Low Ripple and High Detection Speed," 2018 IEEE International Symposium on Circuits and Systems (ISCAS), May 27-30, 2018, IEEE, 5 pages.
Notice of Allowance for U.S. Appl. No. 17/011,313, dated Nov. 4, 2021, 8 pages.
Non-Final Office Action for U.S. Appl. No. 16/597,952, dated Nov. 10, 2021, 9 pages.
Quayle Action for U.S. Appl. No. 16/855,154, mailed Oct. 25, 2021, 6 pages.
Notice of Allowance for U.S. Appl. No. 17/115,982, dated Nov. 12, 2021, 8 pages.
Non-Final Office Action for U.S. Appl. No. 17/126,561, dated Oct. 14, 2021, 6 pages.
Non-Final Office Action for U.S. Appl. No. 17/073,764, dated Dec. 24, 2021, 22 pages.
Notice of Allowance for U.S. Appl. No. 17/163,642, dated Mar. 1, 2023, 10 pages.
Final Office Action for U.S. Appl. No. 17/073,764, dated Mar. 3, 2023, 14 pages.
International Preliminary Report on Patentability for International Patent Application No. PCT/US2021/052830, dated Feb. 20, 2023, 21 pages.
Advisory Action for U.S. Appl. No. 17/073,764, dated May 26, 2023, 3 pages.
First Office Action for Chinese Patent Application No. 202010083654.0, dated May 12, 2023, 17 pages.

\* cited by examiner

ENVELOPE TRACKING CIRCUITRY

RELATED APPLICATIONS

This application claims the benefit of provisional patent application Ser. No. 62/966,574, filed Jan. 28, 2020, the disclosure of which is hereby incorporated herein by reference in its entirety.

FIELD OF THE DISCLOSURE

The present disclosure is related to envelope tracking power supply circuitry and in particular to envelope tracking power supply circuitry with reduced complexity and improved envelope tracking capability.

BACKGROUND

Envelope tracking power supplies for radio frequency power amplifiers enable increased performance and efficiency. However, circuitry for generating envelope tracking signals is often complex and, in some situations, cannot generate an ideal envelope tracking power supply signal. Accordingly, there is a need for envelope tracking power supply circuitry with reduced complexity and improved envelope tracking capability.

SUMMARY

Disclosed is envelope tracking circuitry having an envelope tracking integrated circuit (ETIC) coupled to a power supply and configured to provide an envelope tracked power signal to a power amplifier (PA) with a filter equalizer configured to inject an error-correcting signal into the ETIC in response to equalizer settings. Further included is PA resistance estimator circuitry having a first peak detector circuit configured to capture within a window first peaks associated with a sense current generated by the ETIC, a second peak detector circuit configured to capture within the window second peaks associated with a scaled supply voltage corresponding to the envelope tracked power signal, comparator circuitry configured to receive the first peak and receive the second peak and generate an estimation of PA resistance, and an equalizer settings correction circuit configured to receive the estimation of PA resistance and update the equalizer settings in response to the estimation of PA resistance.

In another aspect, any of the foregoing aspects individually or together, and/or various separate aspects and features as described herein, may be combined for additional advantage. Any of the various features and elements as disclosed herein may be combined with one or more other disclosed features and elements unless indicated to the contrary herein.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure and, together with the description, serve to explain the principles of the disclosure.

gain adjust, according to the present disclosure.

Figure 16:
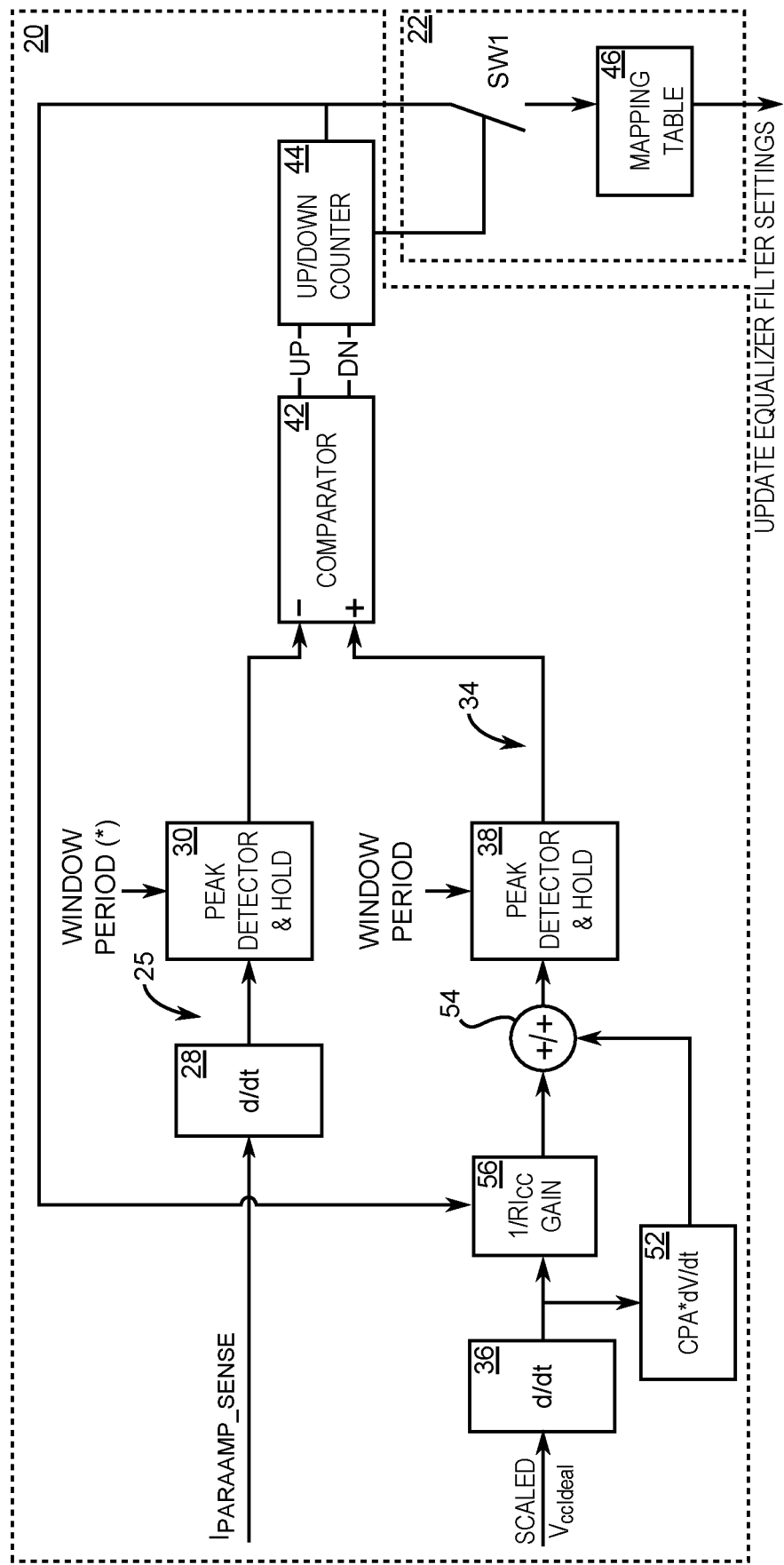
FIG. 16 is a diagram showing yet another embodiment that allows measurement of the load $RI_{CC}$, taking into account the shunt capacitor current CPA and using a single $$\frac{1}{RI_{CC}}$$
Figure 17A:
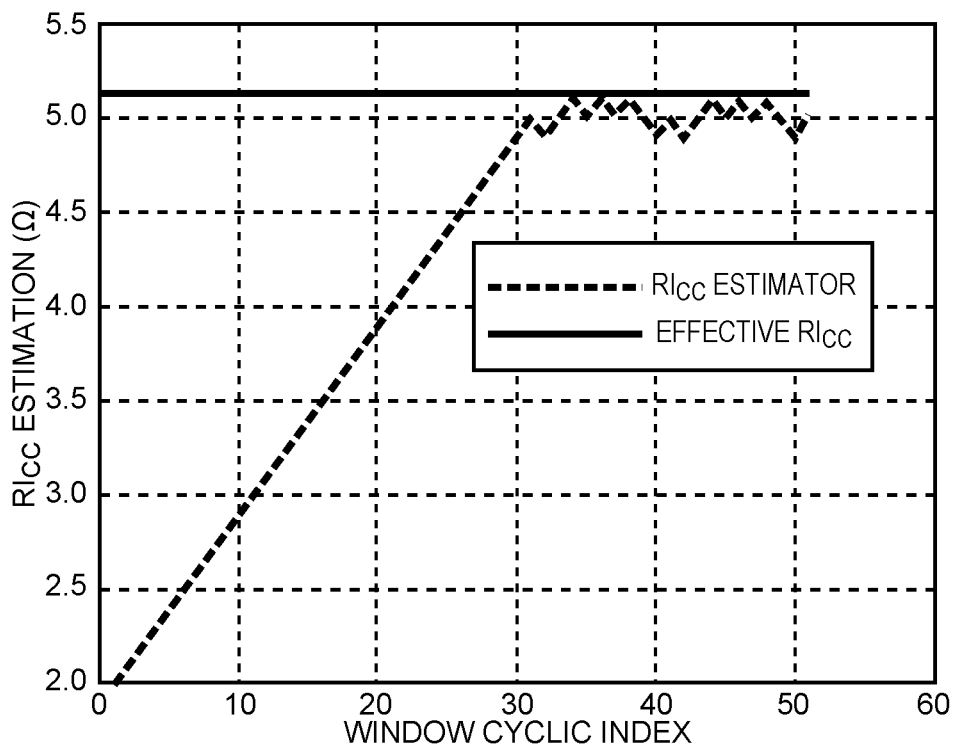
Figure 17B:
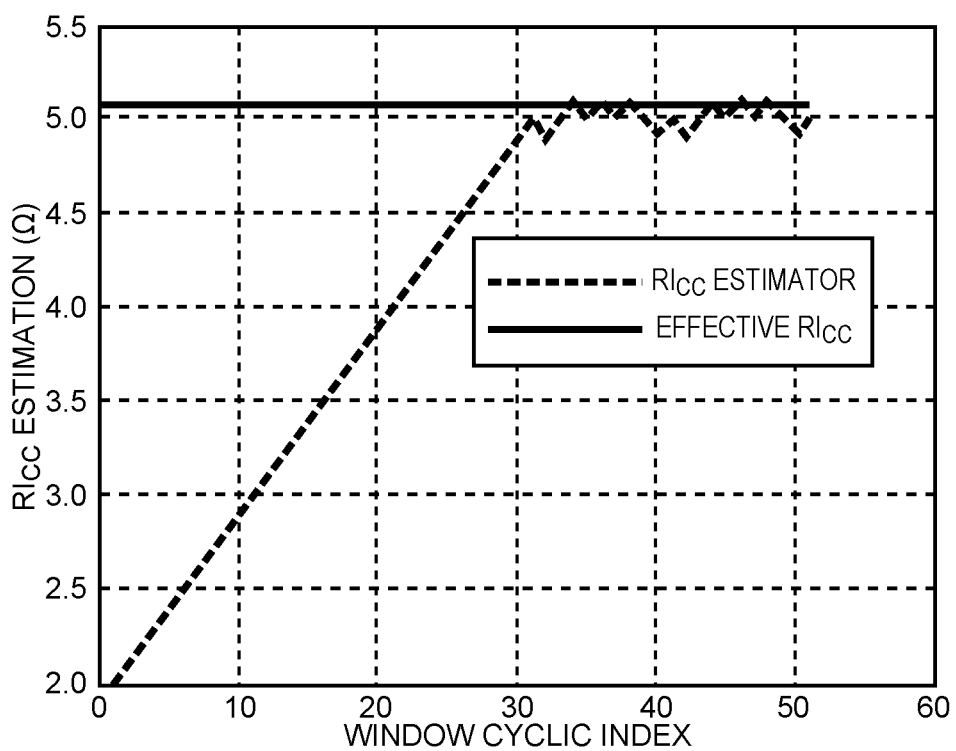

FIGS. 17A and 17B are graphs showing $RI_{CC}$ measurements with the presence of CPA=200 pF using the embodiment of FIG. 16B, in which FIG. 17A depicts results with a delay of 5 ns and FIG. 17B depicts results without any delay.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Embodiments are described herein with reference to schematic illustrations of embodiments of the disclosure. As such, the actual dimensions of the layers and elements can be different, and variations from the shapes of the illustrations as a result, for example, of manufacturing techniques and/or tolerances, are expected. For example, a region illustrated or described as square or rectangular can have rounded or curved features, and regions shown as straight lines may have some irregularity. Thus, the regions illustrated in the figures are schematic and their shapes are not intended to illustrate the precise shape of a region of a device and are not intended to limit the scope of the disclosure. Additionally, sizes of structures or regions may be exaggerated relative to other structures or regions for illustrative purposes and, thus, are provided to illustrate the general structures of the present subject matter and may or may not be drawn to scale. Common elements between figures may be shown herein with common element numbers and may not be subsequently re-described.

The present disclosure relates to several embodiments to measure the equivalent load of an envelope tracking integrated circuit (ETIC) on its modulated power supply voltage $V_{cc}$ output to be used to adjust, for example, the ET signal path of the $V_{ramp}$ filter (VRF) equalizer, which allows compensation of the overall trace inductance and ETIC output equivalent inductance effect when modulating at very wide bandwidth. The method of measuring the load is robust against some delay difference and some non-linear behavior of the sense circuits.

Figure 1:
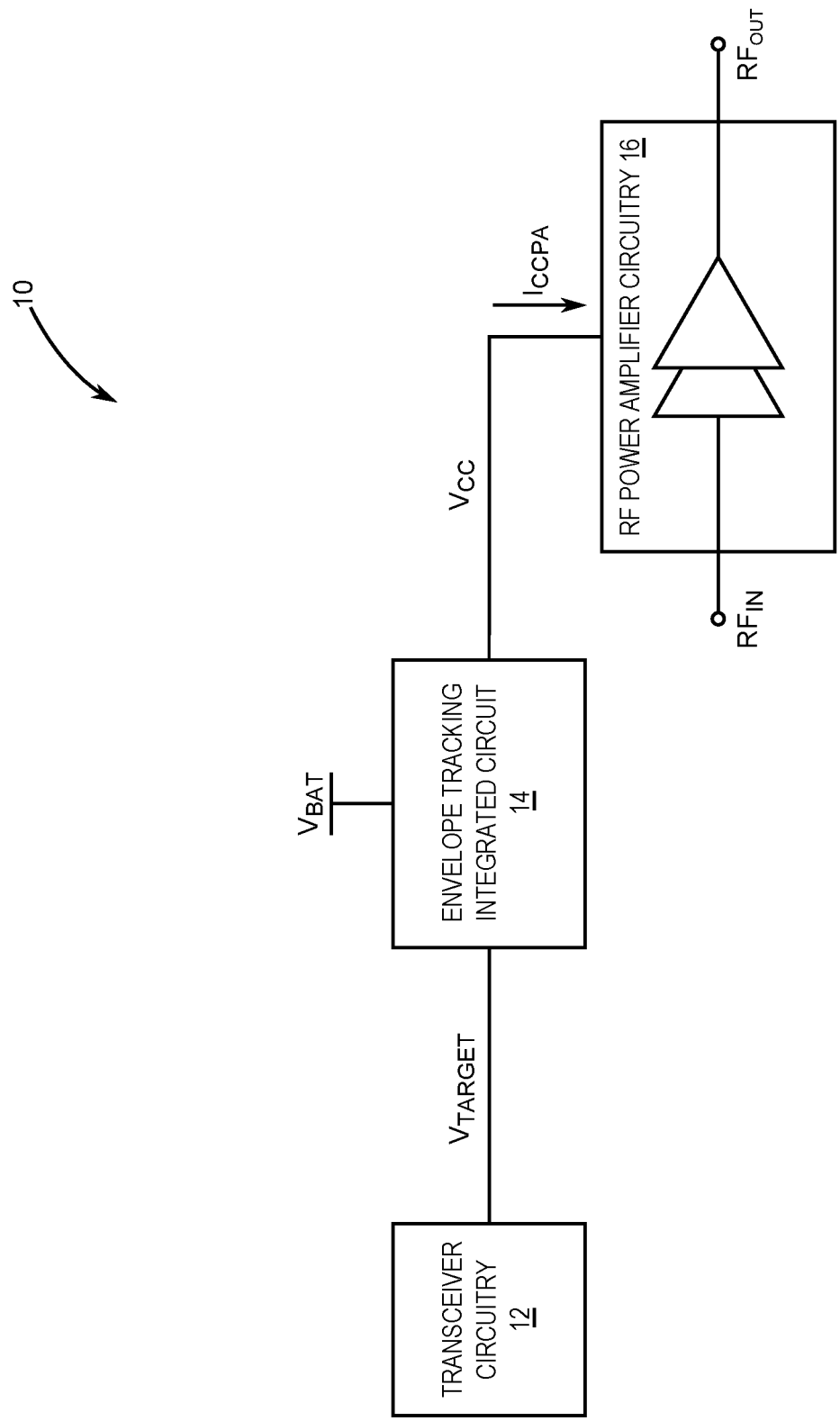
FIG. 1 is a diagram illustrating an envelope tracking power amplifier system according to one embodiment of the present disclosure.

FIG. 1 illustrates a simplified version of an envelope tracking power amplifier system 10 according to one embodiment of the present disclosure. The envelope tracking power amplifier system 10 includes transceiver circuitry 12, an envelope tracking integrated circuit (ETIC) 14 coupled to the transceiver circuitry 12, and radio frequency (RF) power amplifier circuitry 16 coupled to the ETIC 14 such that the ETIC is coupled between the transceiver circuitry 12 and the RF power amplifier circuitry 16. The ETIC 14 is typically powered by a voltage $V_{BAT}$ derived from a battery. In addition to other functions that are not directly pertinent to the present disclosure and thus not discussed herein, the transceiver circuitry 12 is configured to generate a time-variant target voltage signal $V_{TARGET}$ indicative of a power envelope of an RF input signal $RF_{IN}$, which is an RF signal to be amplified by the RF power amplifier circuitry 16. The ETIC 14 is configured to produce a time-variant envelope tracking supply voltage $V_{cc}$ for the RF power amplifier circuitry 16 based on the time-variant target voltage signal $V_{TARGET}$ such that the time-variant envelope tracking supply voltage $V_{cc}$ tracks the power envelope of the RF input signal $RF_{IN}$. The RF power amplifier circuitry 16 is supplied with PA load current IccPA. The RF power amplifier circuitry 16 is configured to amplify the RF input signal $RF_{IN}$ based on the time-variant envelope tracking supply voltage $V_{cc}$ to provide an RF output signal $RF_{OUT}$, which may then subsequently be transmitted from an antenna (not shown).

Those skilled in the art will appreciate that the RF power amplifier circuitry 16 may operate with improved efficiency and linearity when the envelope tracking supply voltage $V_{cc}$ accurately tracks the power envelope of the RF input signal $RF_{IN}$. This is achieved when the envelope tracking supply voltage $V_{cc}$ is temporally aligned with the time-variant target voltage signal $V_{TARGET}$. Temporal alignment between the envelope tracking supply voltage $V_{cc}$ and the target voltage signal may be complicated by the load presented by the RF power amplifier circuitry 16 to the ETIC 14 and stray inductances caused by signal lines (e.g., circuit board traces) located between the ETIC 14 and the RF power amplifier circuitry 16.

Figure 2:
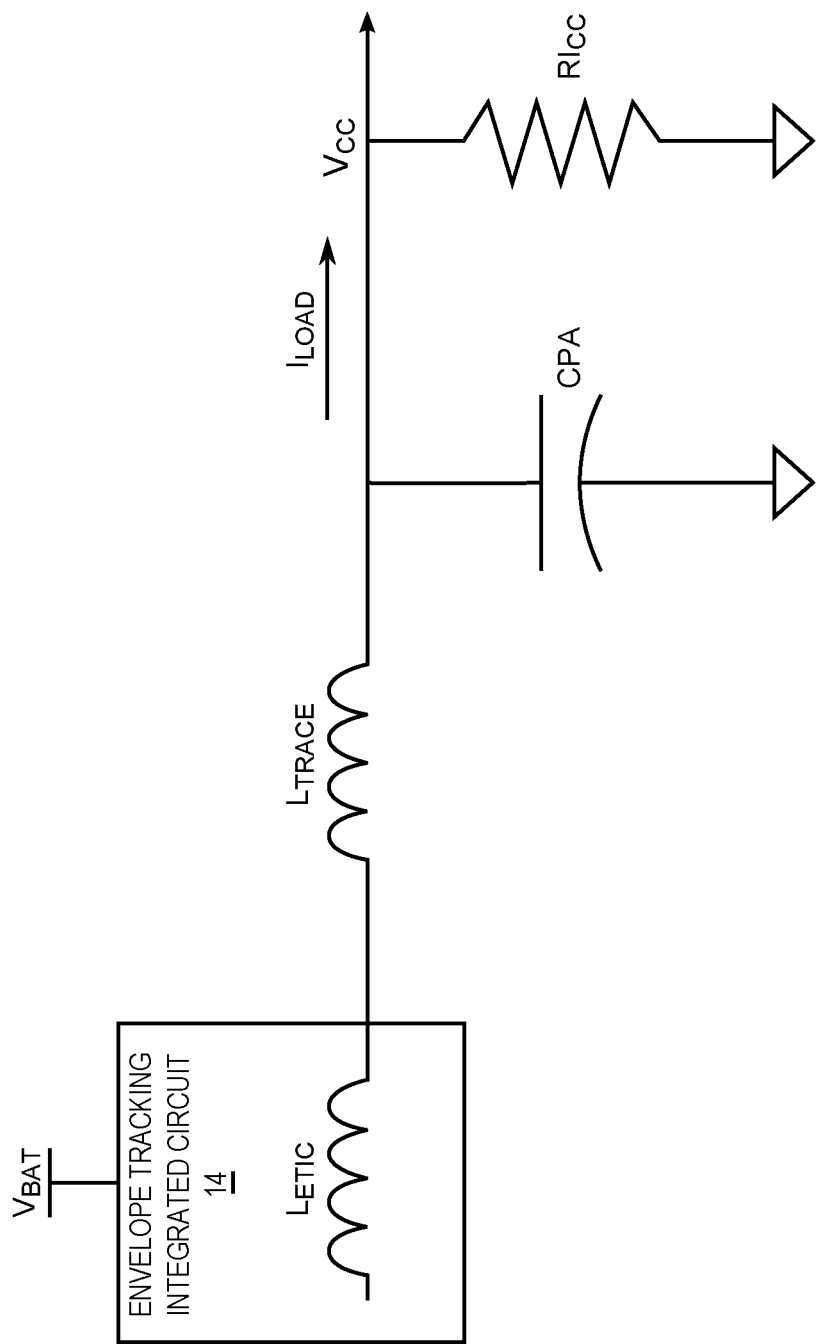
FIG. 2 is a diagram illustrating an equivalent circuit for a load presented by radio frequency (RF) power amplifier circuitry to an envelope tracking integrated circuit (ETIC).

To illustrate this, FIG. 2 shows a simplified equivalent circuit for the load presented to the ETIC 14 by the RF power amplifier circuitry 16. An output inductance of the ETIC 14 is illustrated as $L_{ETIC}$, an inductance caused by circuit board traces between the ETIC 14 and the RF power amplifier circuitry 16 is illustrated as $L_{TRACE}$, a capacitance of the RF power amplifier circuitry 16 as presented to the ETIC 14 is illustrated as CPA, and a resistance of the RF power amplifier circuitry 16 as presented to the ETIC 14 is illustrated as $RI_{CC}$. As discussed above, the ETIC provides the envelope tracking supply voltage $V_{cc}$ to the RF power amplifier circuitry 16. Due to the load presented by the RF power amplifier circuitry 16, a load current $I_{LOAD}$ is also generated. The load current $I_{LOAD}$ is based on the envelope tracking supply voltage $V_{cc}$. A transfer function H(s) can be calculated for the equivalent circuitry shown in FIG. 2. A transfer function of a system (in the s-domain) can be expressed according to the following equation:

$$H(s) = \frac{N(s)}{D(s)}$$

where N(s) and D(s) are simple polynomials that define one or more zeros and one or more poles of the transfer function, respectively, and $s=j2\pi f$. The one or more zeros are the roots of the polynomial equation N(s) and can be determined by solving the equation N(s)=0. The order of the polynomial N(s) determines the number of zeros of the transfer function H(s). Each zero corresponds to a zero output of the transfer function H(s). The polynomial N(s) is a zero-order polynomial when N(s) represents a constant value, is a first-order polynomial when $N(s)=1+b_0s$ (where $b_0$ is a constant), is a second-order polynomial when $N(s)=1+b_0s+b_1s^2$ (where $b_1$ is a constant), and so on. When N(s) is a second-order polynomial, the transfer function H(s) is referred to herein as a second-order complex-zero transfer function.

In contrast to the zeros, the one or more poles are the roots of the polynomial D(s) and can be determined by solving the equation D(s)=0. The order of the polynomial D(s) determines the number of poles of the transfer function H(s). Each pole corresponds to an infinite output of the transfer function H(s). The polynomial D(s) is a zero-order polynomial when D(s) represents a constant value, is a first-order polynomial when $D(s)=1+a_0s$ (where $a_0$ is a constant), is a second-order polynomial when $D(s)=1+a_0s+a_1s^2$ (where $a_1$ is a constant), and so on. When D(s) is a second-order polynomial, the transfer function H(s) is referred to herein as a second-order complex-pole transfer function.

Figure 3:
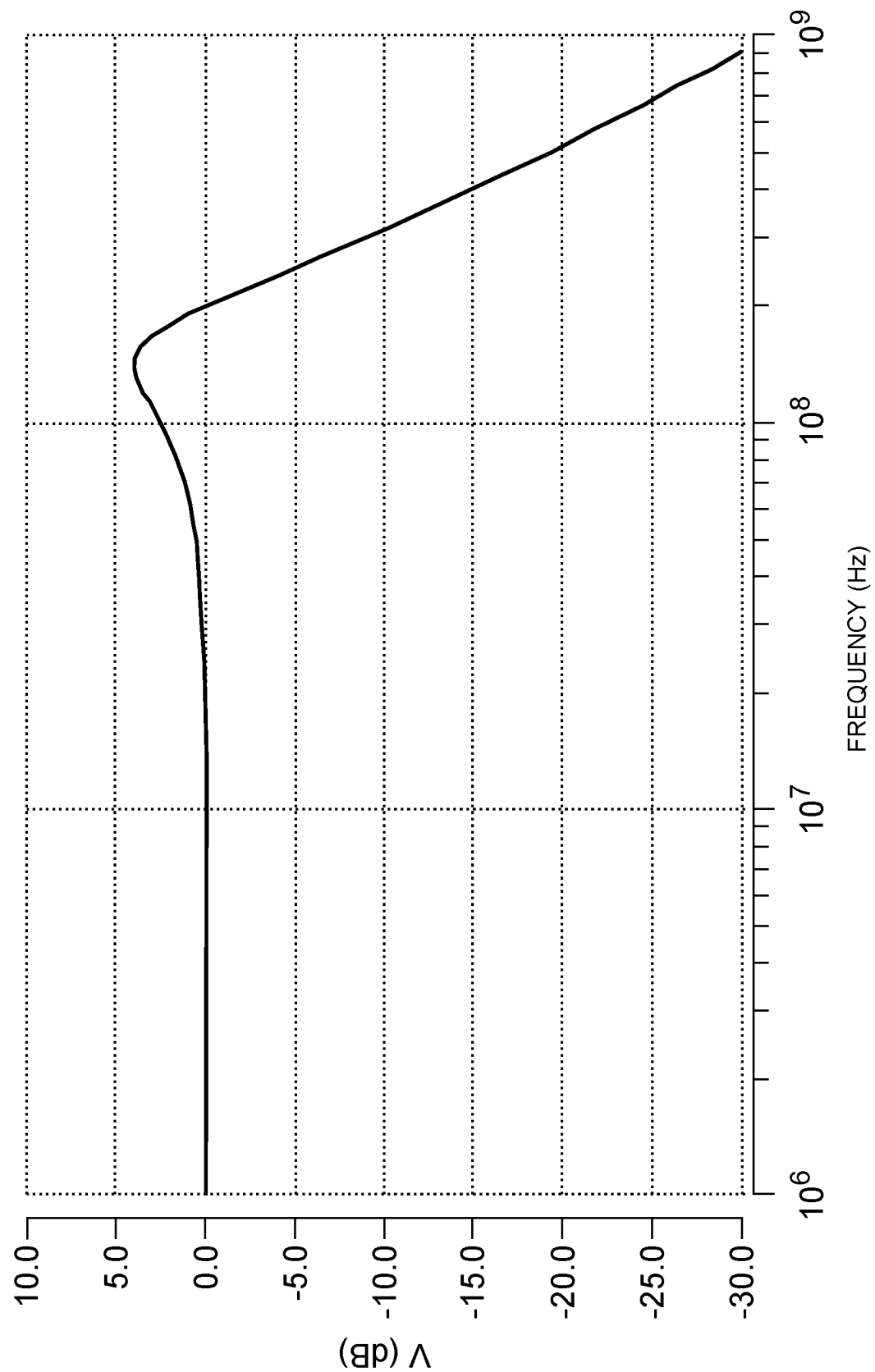
FIG. 3 is a graph illustrating a transfer function of a load presented by RF power amplifier circuitry to an ETIC.

Turning back to the equivalent circuit shown in FIG. 2, the transfer function H(s) of the equivalent circuit can be calculated according to the following equation:

$$H(s) = \frac{1}{1 + \left(\frac{LE}{RI_{CC}}\right)s + (LE * CPA)s^2}$$

where $LE=L_{ETIC}+L_{TRACE}$. The transfer function H(s) provided by the load presented by the RF power amplifier circuitry 16 has two complex poles that are complex conjugates and thus is referred to as a second-order complex-pole transfer function. A graph of the transfer function H(s) over frequency is illustrated in FIG. 3 for given values LE=4 nH, CPA=250 pF, and $RI_{CC}$=6Ω. As shown, the complex pole pair causes peaking at around 141 MHz, and a steep decline thereafter. Ideally, this curve remains flat throughout the entire bandwidth. Going back to the envelope tracking power amplifier system 10 discussed with respect to FIG. 1, the foregoing means that the envelope tracking supply voltage $V_{cc}$ does not accurately track the power envelope of the RF input signal $RF_{IN}$ in some situations, which may lead to decreased performance and/or efficiency.

Figure 4:
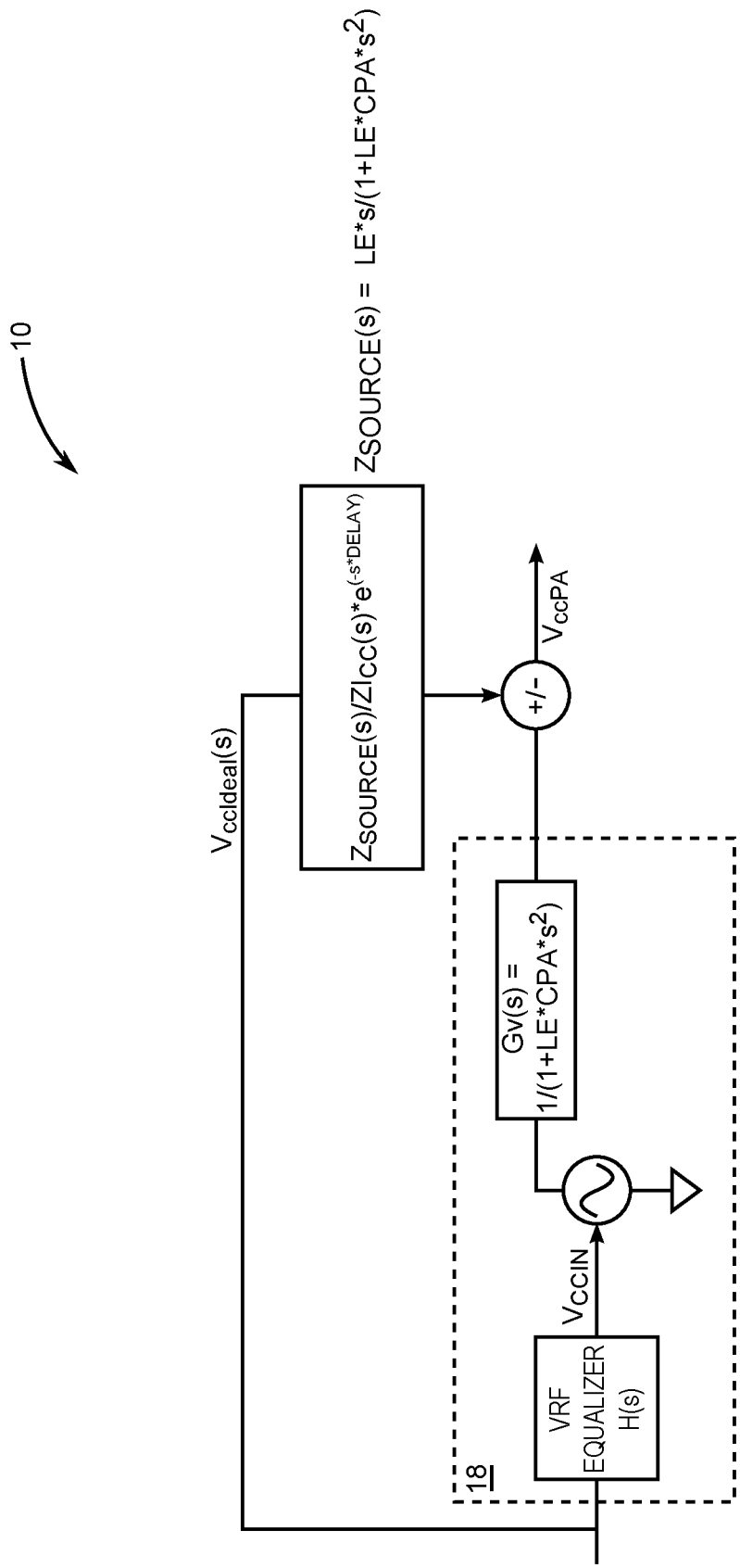
FIG. 4 is an s-domain diagram of the envelope tracking power amplifier system showing that a VRF equalizer compensates the voltage drop across an effective inductance.

An ideal VRF equalizer, for example, is a second-order complex zeros equalizer in which the quality factor (Q) term is proportional to the load $RI_{CC}$ term, as shown in FIG. 2. FIG. 4 is an s-domain diagram of the envelope tracking power amplifier system 10 showing that a VRF equalizer 18 compensates the voltage drop across the effective inductance LE (FIG. 2).

In this regard, a VRF equalizer Q term, which multiplies the Laplace s-transform, is a function of $RI_{CC}$ that can change versus conditions such as voltage standing wave ratio or temperature and requires having a way of measuring $RI_{CC}$ real time, such that the value of $RI_{CC}$ can be used to adjust the VRF equalizer 18 on each consecutive frame. Also needed is to have a way to automatically measure the $RI_{CC}$, that is, the load seen by the ETIC 14, with the capability to be robust against any delay mismatch and with non-linear behavior of some sensing circuits.

Figure 5A:
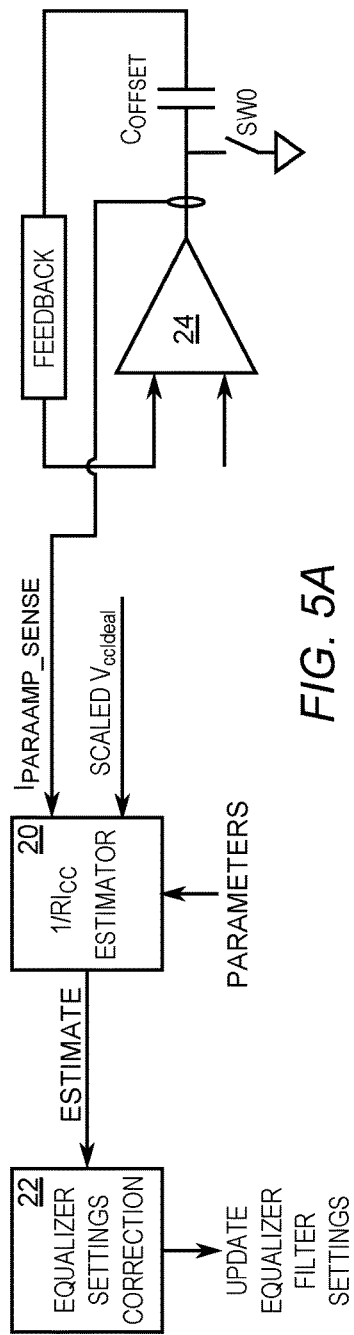
FIG. 5A is a schematic of a section of the exemplary embodiment of the ET system of FIGS. 1 and 4 having power amplifier (PA) resistance estimator circuitry that uses a parallel amplifier sense current and a scaled ideal voltage to estimate in real-time the power amplifier resistance.

FIG. 5A is a schematic of a section of the exemplary embodiment of the ET power amplifier system 10 of FIGS. 1 and 4 having PA resistance estimator circuitry 20 that uses a parallel amplifier sense current $I_{PARAMP\_SENSE}$ and a scaled ideal voltage Scaled_$V_{ccIdeal}$ to estimate in real-time the PA circuitry 16 resistance $RI_{cc}$ or any function of the PA circuitry 16 resistance $RI_{CC}$ (e.g., $$\left(e.g., \frac{1}{RI_{CC}}\right)$$

that the RF power amplifier circuitry 16 (FIG. 1) has. This results in an accurate estimation of the PA circuitry 16 resistance $RI_{CC}$ for very wide modulation bandwidth ET signals as high as 500 MHz because most of the PA load current IccPA (FIG. 1) is provided by a tracking amplifier bandwidth filter (not shown). In this exemplary embodiment, the parallel amplifier sense current $I_{PARAMP\_SENSE}$ is generated by a parallel amplifier 24 that is typically integrated within the ETIC 14. The parallel amplifier 24 may also be referred to as a tracking amplifier. An equalizer settings correction circuit is configured to receive the estimate of the PA circuitry 16 resistance $RI_{CC}$ and in response update equalizer settings.

The embodiment of FIG. 5A allows estimation of the $RI_{CC}$ while not being sensitive to the delay between the sensed voltage and the sensed current, given that it is difficult to accurately align the delay between the two signals that are used to extract the $RI_{CC}$ information. The estimation of the $RI_{CC}$ by the PA resistance estimator circuitry 20 offers robustness against delay mismatch and against some nonlinear behavior of the sensed current.

Figure 5B:
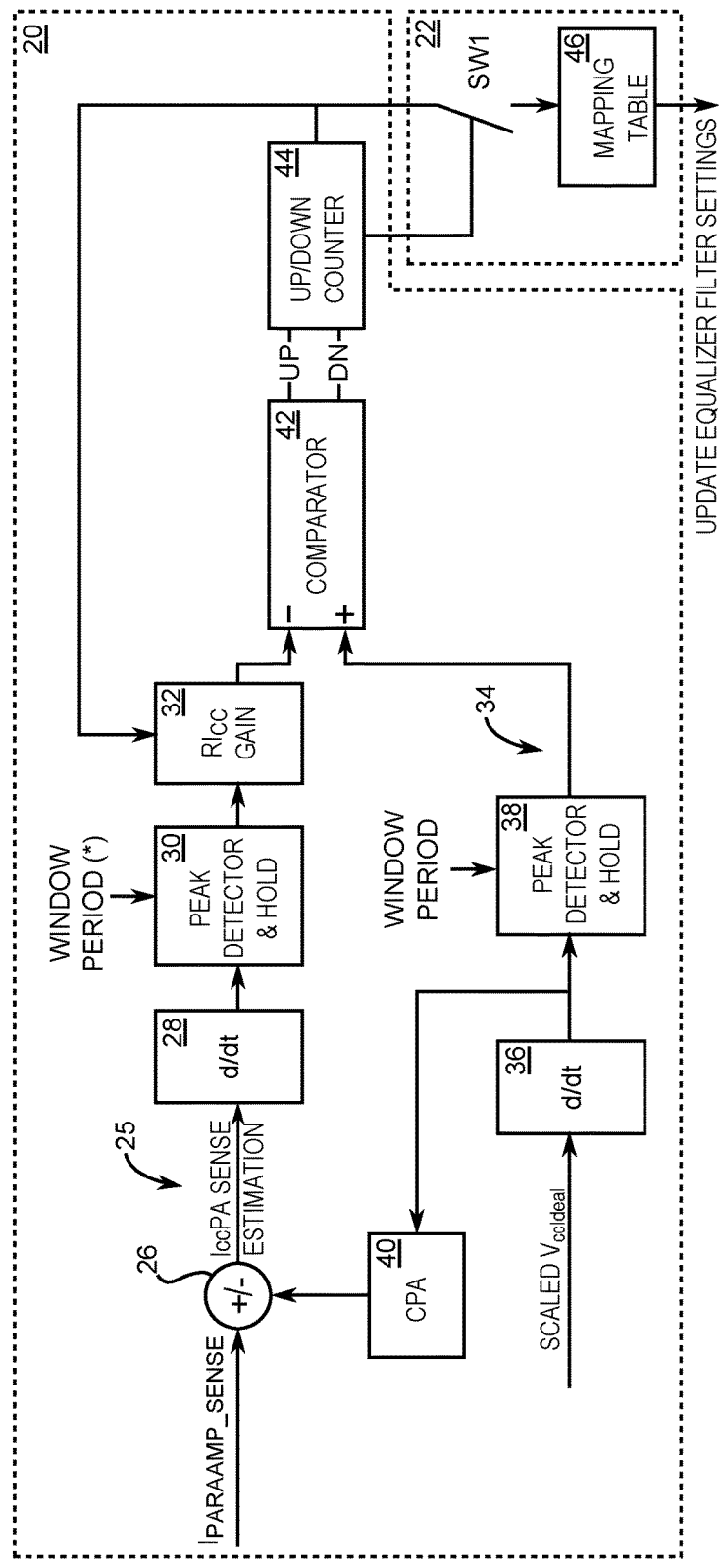
FIG. 5B is a diagram of an embodiment to measure the equivalent power amplifier load ($RI_{CC}$) during operation of the ETIC in real time, according to the present disclosure.

FIG. 5B is a schematic model of a first exemplary embodiment of the PA resistance estimator circuit 20 and the equalizer settings correction circuit 22 for the filter equalizer 18 of FIG. 4. In this first exemplary embodiment, the PA resistance estimator circuit 20 has a first path 25 that includes a difference node 26, a first path derivative function 28, a first peak detector circuit 30, and an $RI_{CC}$ gain circuit 32. A second path 34 includes a second path derivative function 36 and a second peak detector circuit 38. A coefficient 40 that is proportional to the shunt capacitance CPA couples the second path derivative function 36 to the difference node 26. The first peak detector circuit 30 and the second peak detector circuit 38 are configured to perform peak and hold functions within predetermined windows of time. A first slope signal is based on first peaks detected by the first peak detector circuit 30, and a second slope signal is based on second peaks detected by the second peak detector circuit 38.

A comparator 42 is configured to receive and compare the first slope signal passed from the first path 25 and the second slope signal output passed from the second path 34. An up/down counter 44 is configured to receive up and down increment signals from the comparator 42. Output from the up/down counter is fed back to the $RI_{CC}$ gain circuit 32. The first slope signal is adjusted in response to the output from the up/down counter until the first slope signal is substantially equal to the second slope signal. Once the first slope signal and the second slope signal are substantially equal, a final count held by the counter is transferred to a mapping table 46 that outputs updated equalizer filter settings. In at least some embodiments, the mapping table is configured with a look-up table that maps equalizer settings with the estimation of PA resistance. The mapping table may be implemented in a digital logic circuit. The transfer of the final count is symbolically depicted by closing of a switch SW1 at a moment when the first the first slope signal is substantially equal to the second slope signal.

A general operation of the exemplary embodiment of FIGS. 5A and 5B is as follows:
1. The current that the parallel amplifier 24 of the ETIC 14 senses and measures, called $I_{PARAMP\_SENSE}$, is a mirror of the effective parallel amplifier output current that is mostly delivered to a load when modulating very wide bandwidth.
2. The target modulated voltage, referred to as $V_{ccIdeal}$, or any intermediate $V_{cc}$ voltage, is also sensed and is called scaled $V_{ccIdeal}$.
3. The $I_{PARAMP\_SENSE}$ current can be added to a correction term that represents the estimated current across the capacitor, which is about $$\frac{CPA*dV_{cc}}{dt} = \frac{CPA*dV_{ccIdeal}}{dt},$$

but this term may not be so large, depending on the modulation slew rate, also known as the $$\frac{dV_{ccIdeal}}{dt},$$

and the value of the capacitor. The correction term needs some delay alignment with the $I_{PARAMP\_SENSE}$. The resulting sum is called PA load current IccPA sense, which is an estimation of the load current.
4. From the estimated PA load current IccPA sense is applied a derivative to obtain the slope of the load current. Similarly, a similar derivative is applied to the scaled $V_{ccIdeal}$ to obtain the slope of the load voltage.
5. Then, peak detectors detect the peak of the slopes in a given window of time, or samples: one peak detector operating on a given window of time for the slope of the PA load current IccPA and another peak detector operating on the same window of time for the slope of $V_{ccIdeal}$.
6. At the end of each window of time, the detected peak outputs are put on hold and an $RI_{CC}$ gain scaling term is used to multiply the output of the peak detector of the PA load current IccPA. The multiplied value is compared with the peak output of the $V_{ccIdeal}$ slope, and if the value is lower, a counter is used to increment the $RI_{CC}$ gain term by a small steps and then another cycle of window measurements is repeated on another time section of the current and voltage signals.
7. After several consecutives window cycles, the value of the $RI_{CC}$ gain term converges to the effective load value and toggles eventually by the increment/decrement value. After a certain defined number of window cycles, it is possible to put on hold the overall $RI_{CC}$ measurement loop. The loop can be restarted on another, subsequent window of frame.

Embodiments according to the present disclosure allows estimation of the load value even if the sense current IccPA and the sense voltage $V_{ccIdeal}$ do not have perfect alignment to each other in time, because the use of peak value of slopes to calculate the direction to increase or decrease the $RI_{CC}$ makes the system loop not dependent on delay alignment since both peaks are still related to each other by the $RI_{CC}$, that is, $$RI_{CC} = \frac{\text{peak } V_{ccIdeal}}{\text{peak } IccPA}$$

in a given time window, even though the peak detection output change happens later in time due to delay.

Operation of this first embodiment is best explained by the following equation for the alternating current portions: $I_{PARAMP}-ICPA=IccPA$, where ICPA is the current across the capacitor CPA, IccPA is the power amplifier load current, and $I_{PARAMP}$ is the parallel amplifier current.

$$ICPA = \frac{CPA*dV_{ccPA}}{dt},$$

where the $V_{ccPA}$ is the voltage across the capacitor and across the power amplifier.

IccPA can be expressed as $IccPA = \frac{V_{ccPA}}{RI_{CC}}$.

$$I_{PARAMP}(t) - \frac{CPA * dV_{ccPA}(t)}{dt} = \frac{V_{ccPA}(t)}{RI_{CC}}.$$

If one assumes for the first embodiment approach that the term $$\frac{CPA * dV_{ccPA}}{dt}$$

is negligible, then $$I_{PARAMP}(t) \cong \frac{V_{ccPA}(t)}{RI_{CC}} \rightarrow I_{PARAMP}(t) * RI_{CC} \cong V_{ccPA}(t).$$

Subsequently, other embodiments address this when $$\frac{CPA * dV_{ccPA}}{dt}$$

is not negligible.

If a signal voltage $V_{ccIdeal}(t)$ is used instead of the $V_{ccPA}(t)$ that has delay relative to the other, then $I_{PARAMP}(t) * RI_{CC} \cong V_{ccIdeal}(t-\tau)$, where $\tau$ represents a delay difference between the signal $V_{ccIdeal}$ and the $I_{PARAMP}$, but with $V_{ccIdeal}(t)$ and $I_{PARAMP}(t)$ signals, the equation $I_{PARAMP}(t) * RI_{CC}$ is not equal to $V_{ccIdeal}(t)$, unless the delay $\tau$ is estimated and the signal $V_{ccIdeal}$ is delayed in order to calculate $RI_{CC}$, which should be avoided.

The approach is then to use a maximum approach based on a given window of time applied on the derivative of the signals, that is, $$\max(\Delta I_{PARAMP}(t_k:t_{k+1}))*RI_{CC} \cong \max(\Delta V_{ccIdeal}(t_k:t_{k+1})),$$

with $t_{k+1}-t_k$ being the window time length that should at least exceed the delay $\tau$ length. This maximum equation is valid for $RI_{CC}$ extraction.

For example, simulating the foregoing algorithm with a load of 5 ohms using ET-100 MHz 5G New Radio modulated waveforms, the $RI_{CC}$ converges to 5 ohms for the case of no delay mismatch. Each window time is 150 ns in this simulation example.

Figure 6:
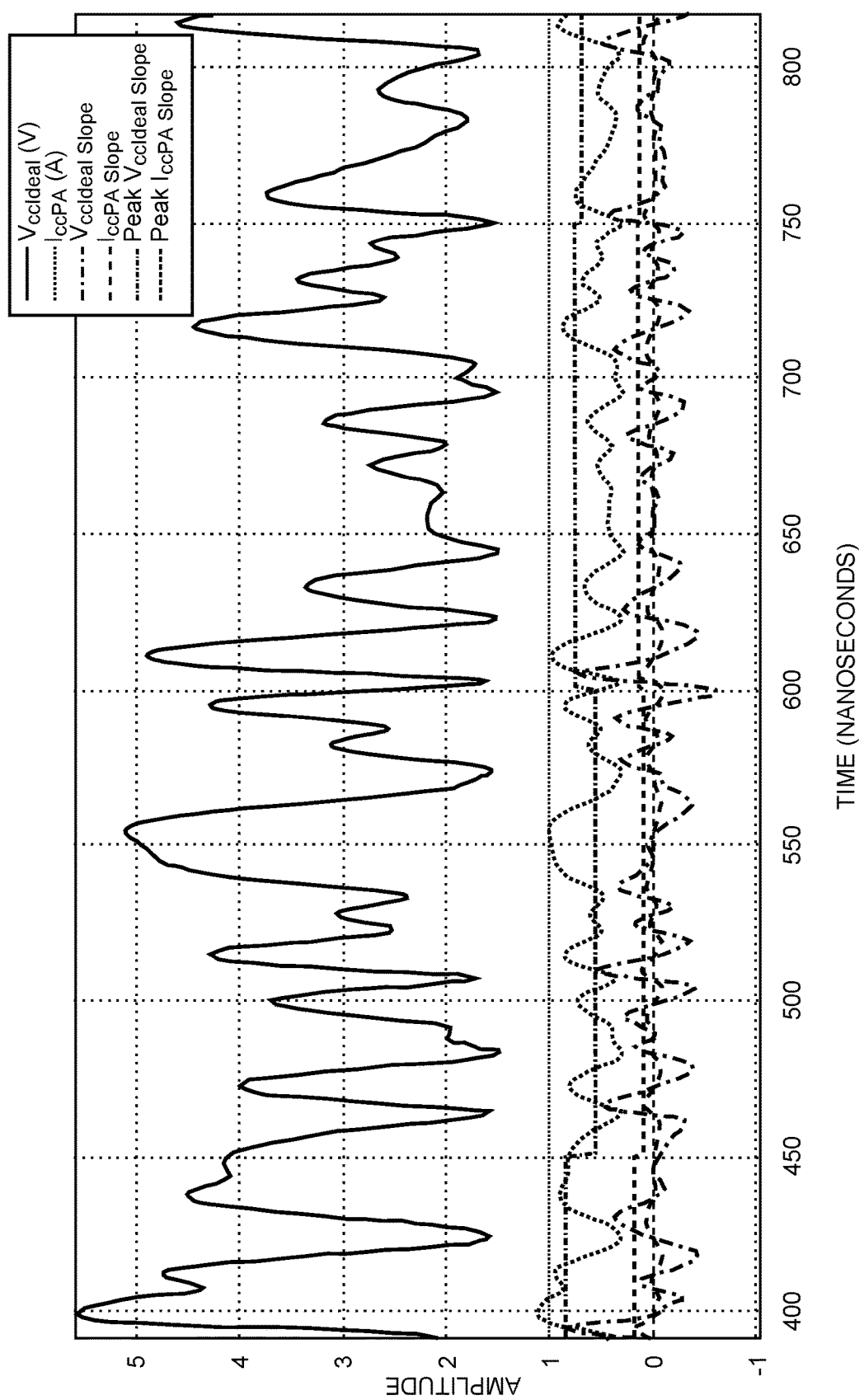
FIG. 6 is a graph showing simulation of $RI_{CC}$ with a case of no delay mismatch between power amplifier load current (IccPA) and target modulated voltage ($V_{ccIdeal}$) during processing.
Figure 7A:
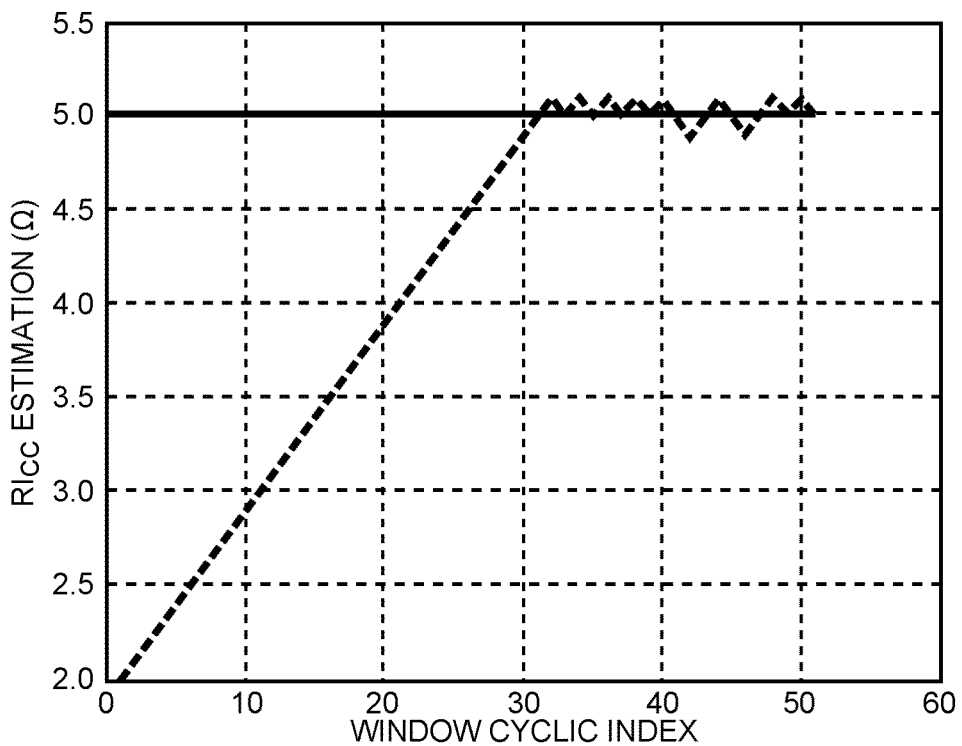
FIG. 7A is a graph of $RI_{CC}$ estimation versus window cyclic index with no delay mismatch between power amplifier load current (IccPA) and target modulated voltage ($V_{ccIdeal}$).
Figure 7B:
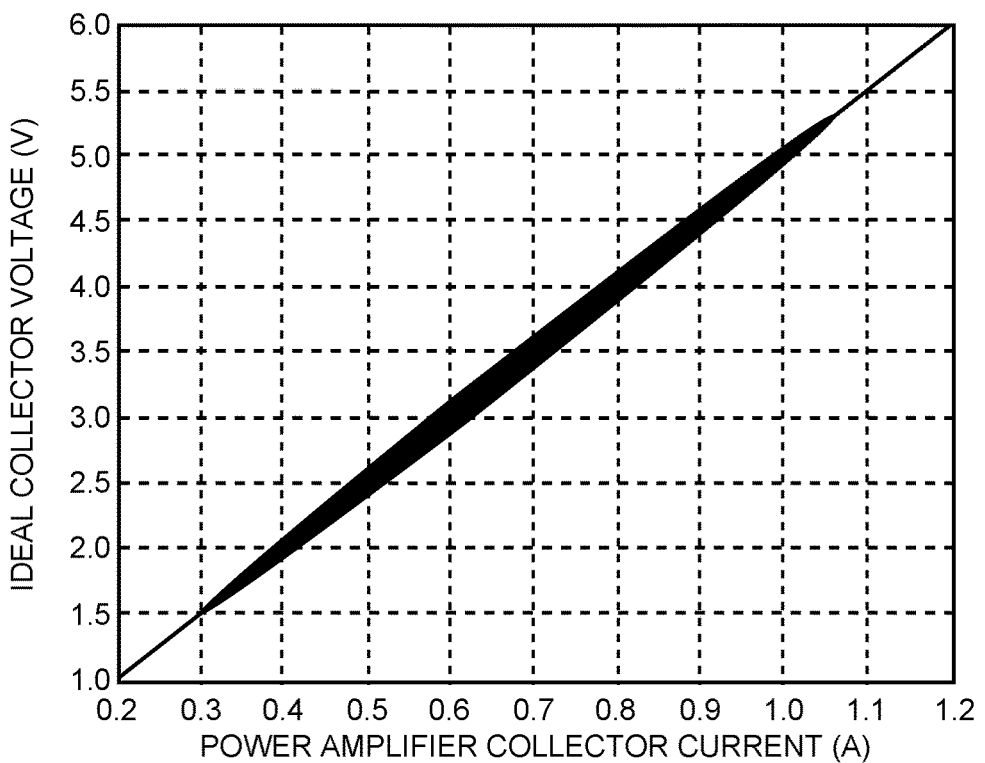
FIG. 7B is a graph of ideal collector voltage versus power amplifier collector current with no delay mismatch between power amplifier load current (IccPA) and target modulated voltage ($V_{ccIdeal}$).

FIG. 6 shows a simulation of $RI_{CC}$ with the case of no delay mismatch between power amplifier load current (IccPA) and target modulated voltage ($V_{ccIdeal}$) in the processing. FIG. 7A is a graph of $RI_{CC}$ estimation versus window cyclic index with no delay mismatch between power amplifier load current (IccPA) and target modulated voltage ($V_{ccIdeal}$). FIG. 7B is a graph of ideal collector voltage versus power amplifier collector current with no delay mismatch between power amplifier load current (IccPA) and target modulated voltage ($V_{ccIdeal}$).

Figure 8:
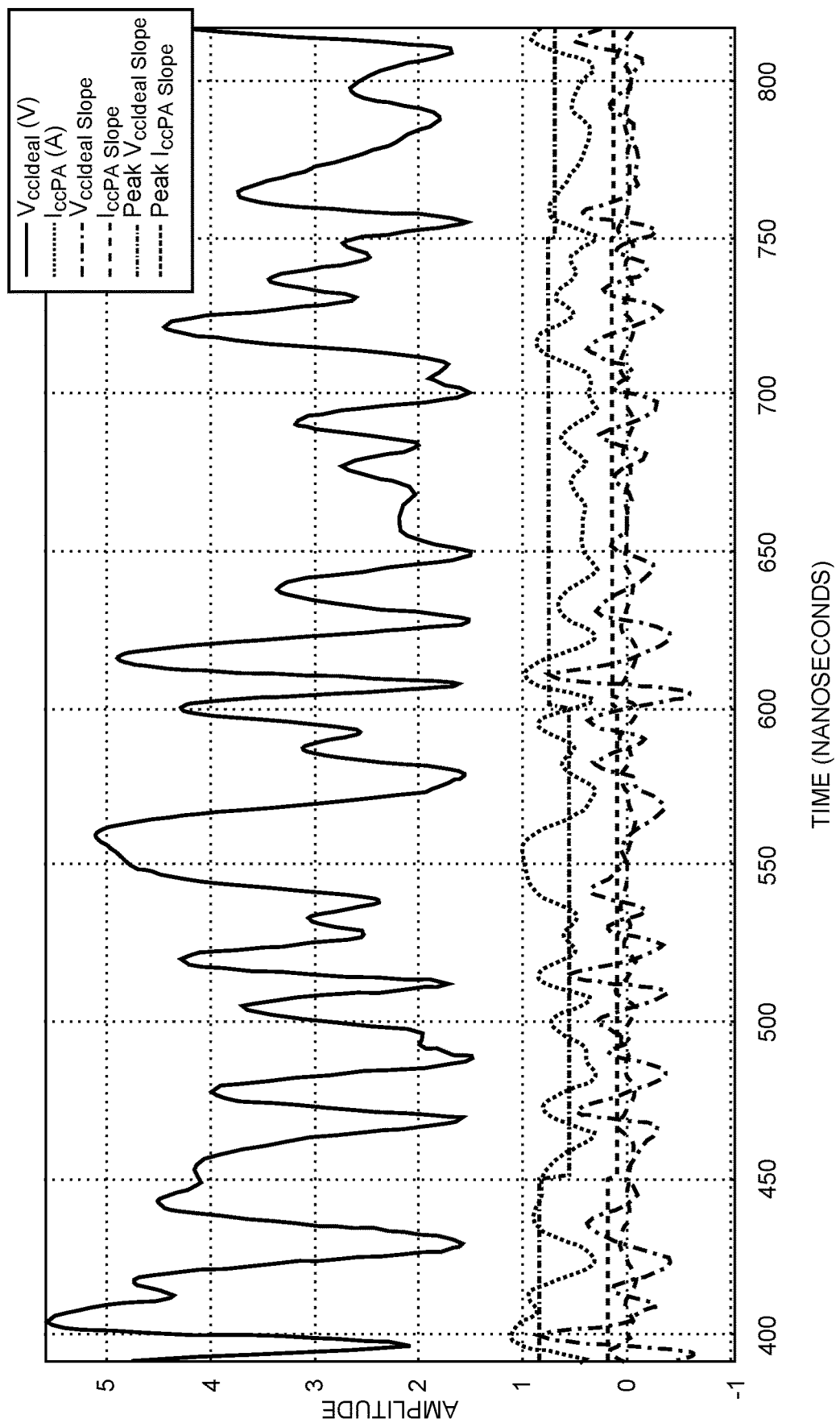
FIG. 8 is a graph showing simulation of $RI_{CC}$ with a case of −5 ns delay mismatch between power amplifier load current IccPA and target modulated voltage $V_{ccIdeal}$ in the processing.
Figure 9A:
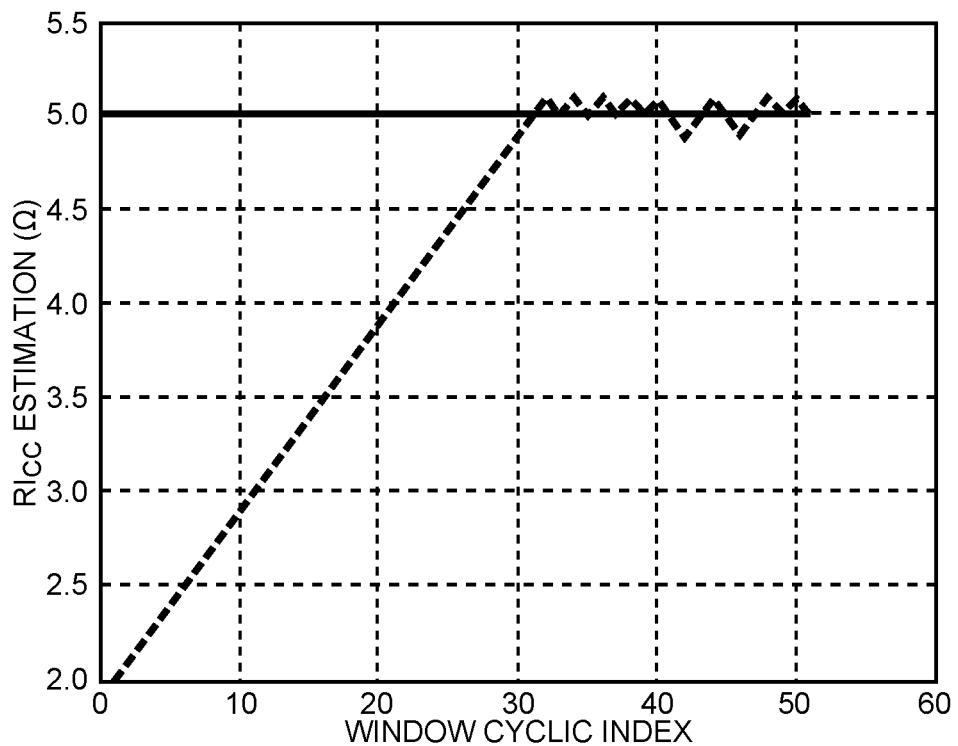
FIG. 9A is a graph of $RI_{CC}$ estimation versus window cyclic index with the case of −5 ns delay mismatch between power amplifier load current (IccPA) and target modulated voltage ($V_{ccIdeal}$).
Figure 9B:
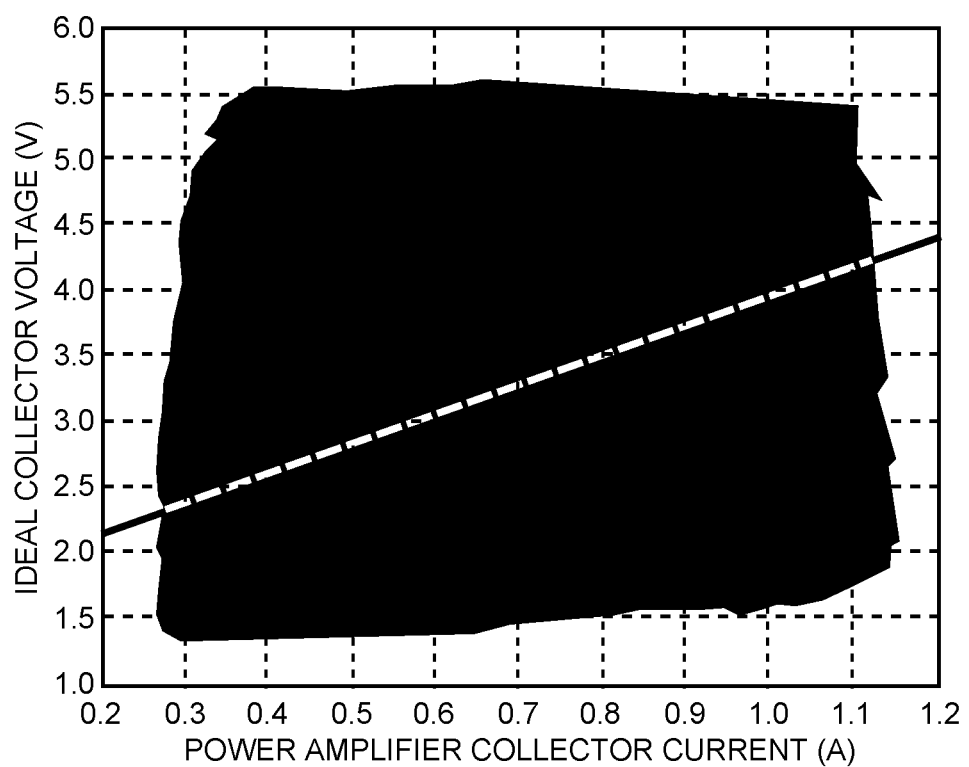
FIG. 9B is a graph of ideal collector voltage versus power amplifier collector current with the case of −5 ns delay mismatch between power amplifier load current (IccPA) and target modulated voltage ($V_{ccIdeal}$).

FIG. 8 is a graph showing simulation of $RI_{CC}$ with a case of −5 ns delay mismatch between the power amplifier load current IccPA and $V_{ccIdeal}$ in the processing. If the −5 ns delay mismatch between the power amplifier load current IccPA and $V_{ccIdeal}$ is introduced, the algorithm still is robust and still converges to 5 ohms, as is depicted in FIG. 9A. FIG. 9B is a graph of ideal collector voltage versus power amplifier collector current with the case of −5 ns delay mismatch between power amplifier load current (IccPA) and target modulated voltage ($V_{ccIdeal}$).

Figure 10A:
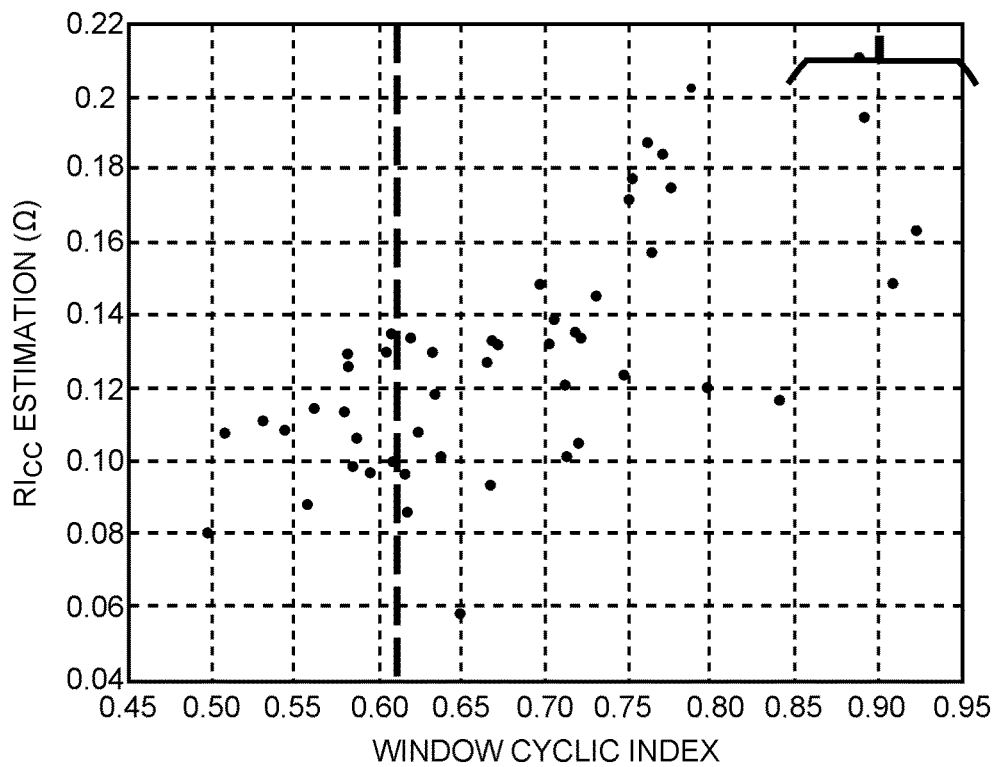
FIG. 10A is a plot showing the peak of slope IccPA for different window cycles versus the power amplifier load current IccPA.

Another aspect of the embodiment according to the present disclosure is that the measurements of peaks of slopes in a defined window of time are used. Most of the peak of slope occurrences fall somewhat away from the upper IccPA peak current and $V_{ccIdeal}$ peak voltage, and for example, it may be difficult to have good sensing fidelity at the peak current of the power amplifier load current IccPA. FIG. 10A shows the occurrence of peak of slope of the power amplifier load current IccPA for each window cycle of 150 ns versus the power amplifier load current IccPA current value and shows that very rare peaks of slope happen at the peak current, so it is not so critical to have distortion or clipping on the sense current value, which does not much affect the loop convergence.

Figure 10B:
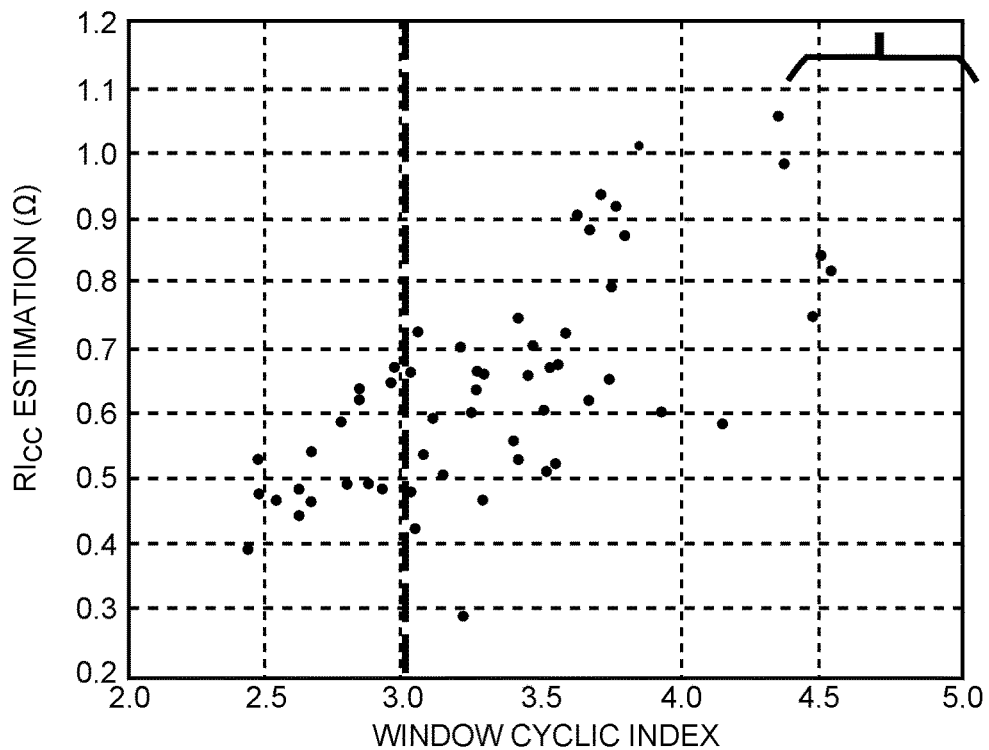
FIG. 10B is a plot showing a peak of slope $V_{ccIdeal}$ for different window cycles versus the target modulated voltage $V_{ccIdeal}$.

FIG. 10B shows a peak of slope $V_{ccIdeal}$ for different window cycles versus the $V_{ccIdeal}$ voltage.

Figure 11:
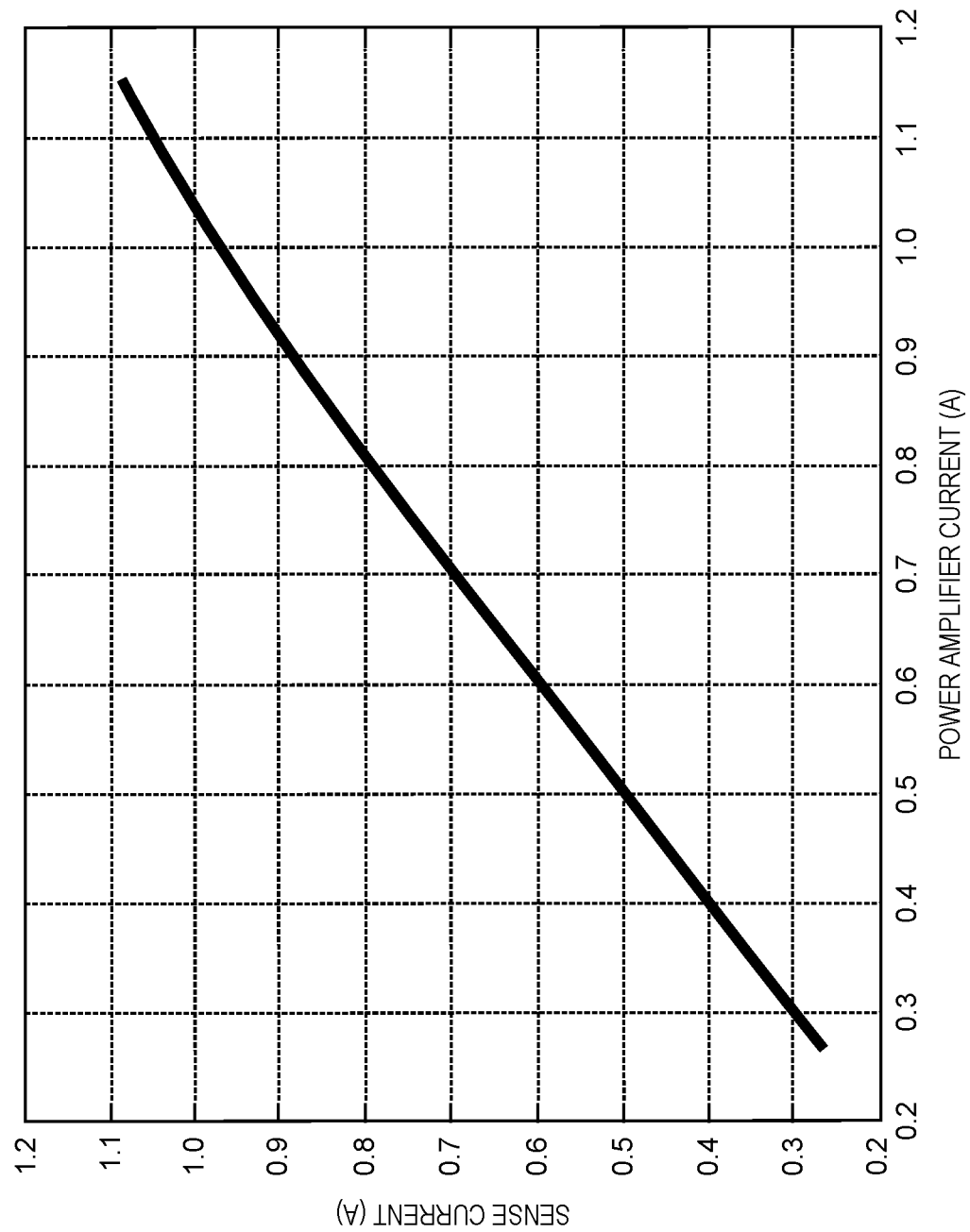
FIG. 11 is a graph of an example of non-linear response of sense current IccPA versus the effective IccPA.

As an example, assume that the sense current of the parallel amplifier is not perfectly linear and has some upper slope change due to non-linear behavior of the sense circuit, like that shown in FIG. 11.

Figure 12A:
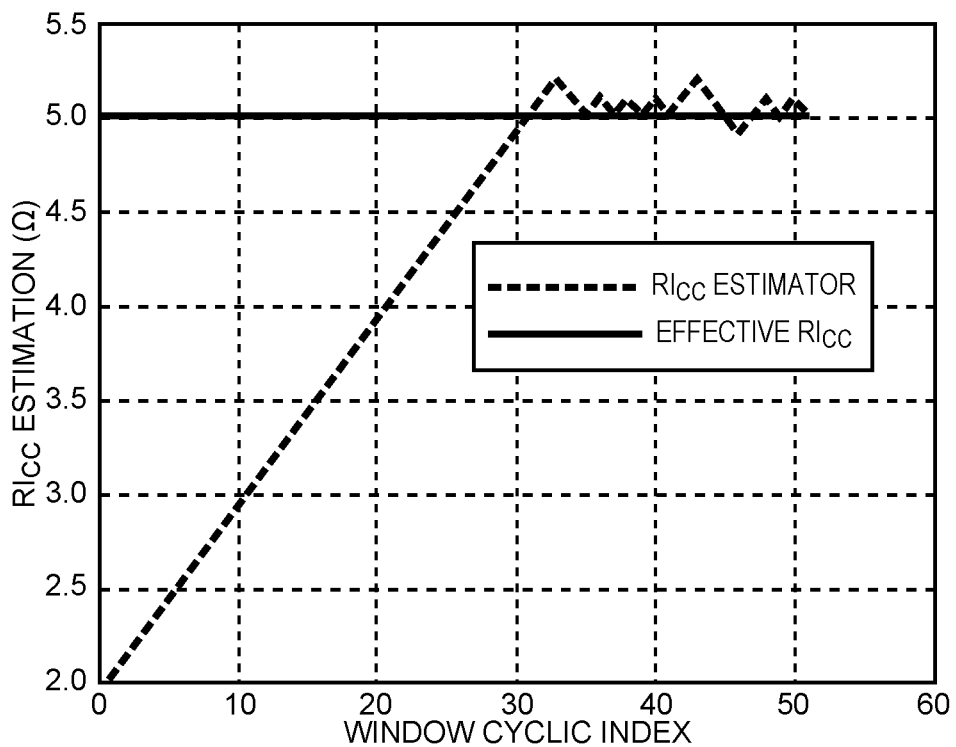
FIGS. 12A and 12B are graphs showing $RI_{CC}$ digital estimation in the presence of some upper non-linear current sensor and without upper non-linear current sensor, respectively.
Figure 12B:
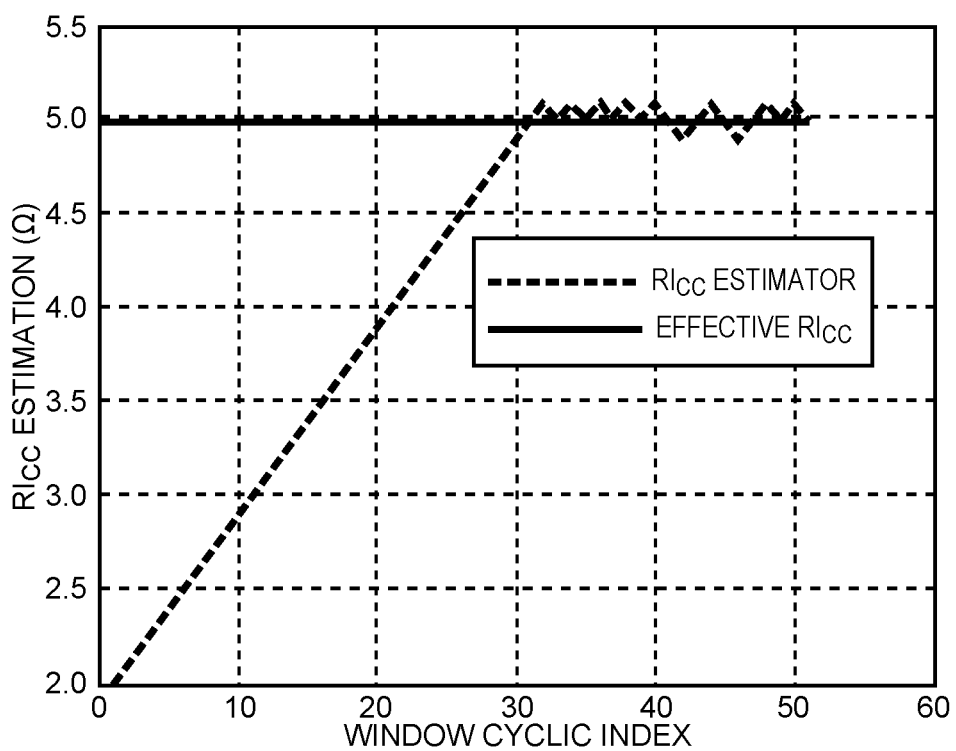

The algorithm still converges correctly with the presence and without the presence of the non-linear behavior at the region where it is less critical, as shown in FIGS. 12A and 12B.

Note that it is also possible to consider different window length periods during the overall measurement period and that some calibration can be performed in the factory when the value of the load $RI_{CC}$ is known via, for example, closing a known load inside the ETIC and running $RI_{CC}$ measurements to calibrate the system.

Figure 13:
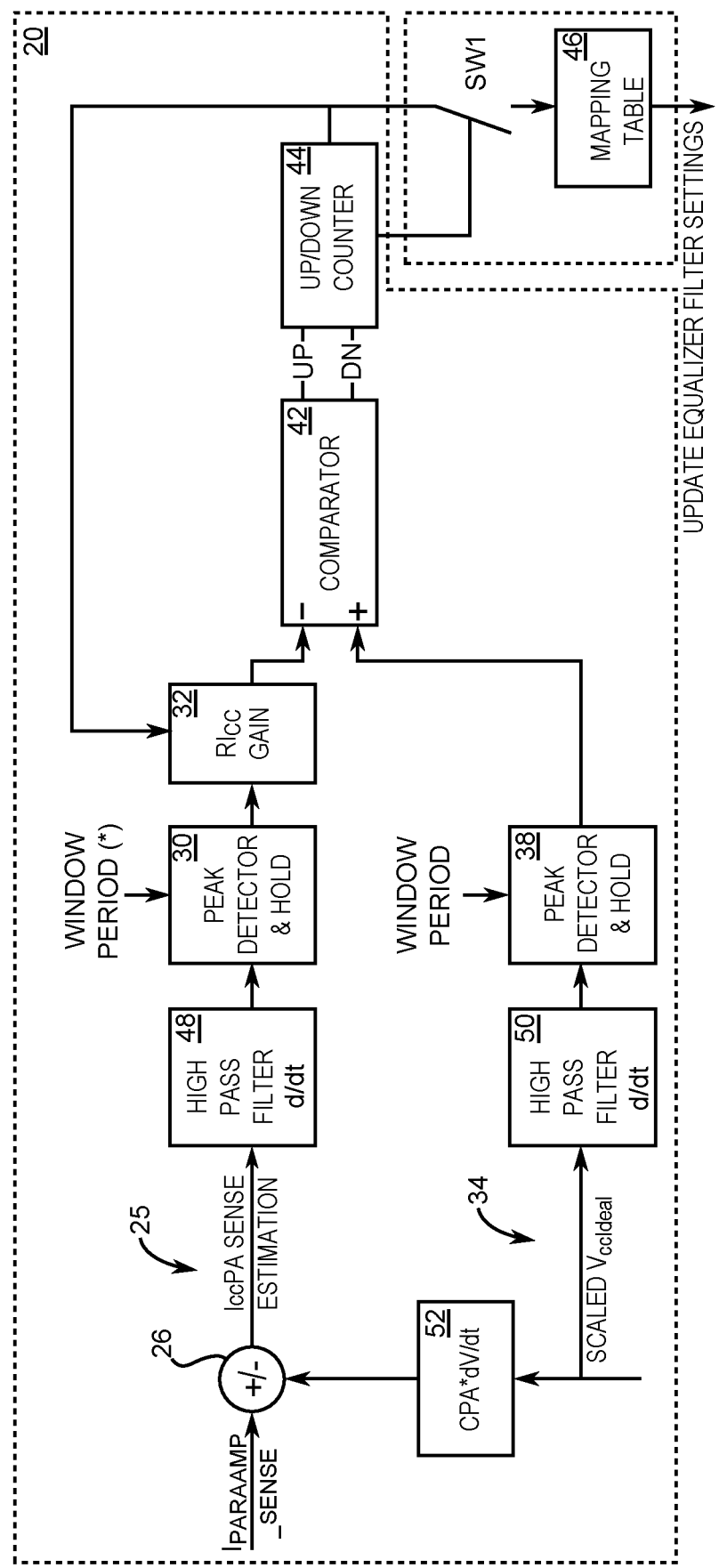
FIG. 13 is a diagram showing an embodiment in which the derivatives are replaced by high-pass passive or active networks, according to the present disclosure.

Another variant of the embodiment according to the present disclosure is shown in FIG. 13, in which, for example, a first path derivative circuit 48 and a second path derivative circuit 50 are each comprised of a high-pass capacitor-resistor-based network (passive or active circuits with operational amplifiers) as an approximation of derivative in a given frequency range of the modulation. Moreover, in this embodiment, a combined constant coefficient and derivative function 52 is coupled between an input of the second path 34 and the difference node 26. The coefficient is proportional to the shunt capacitance CPA.

Figure 14:
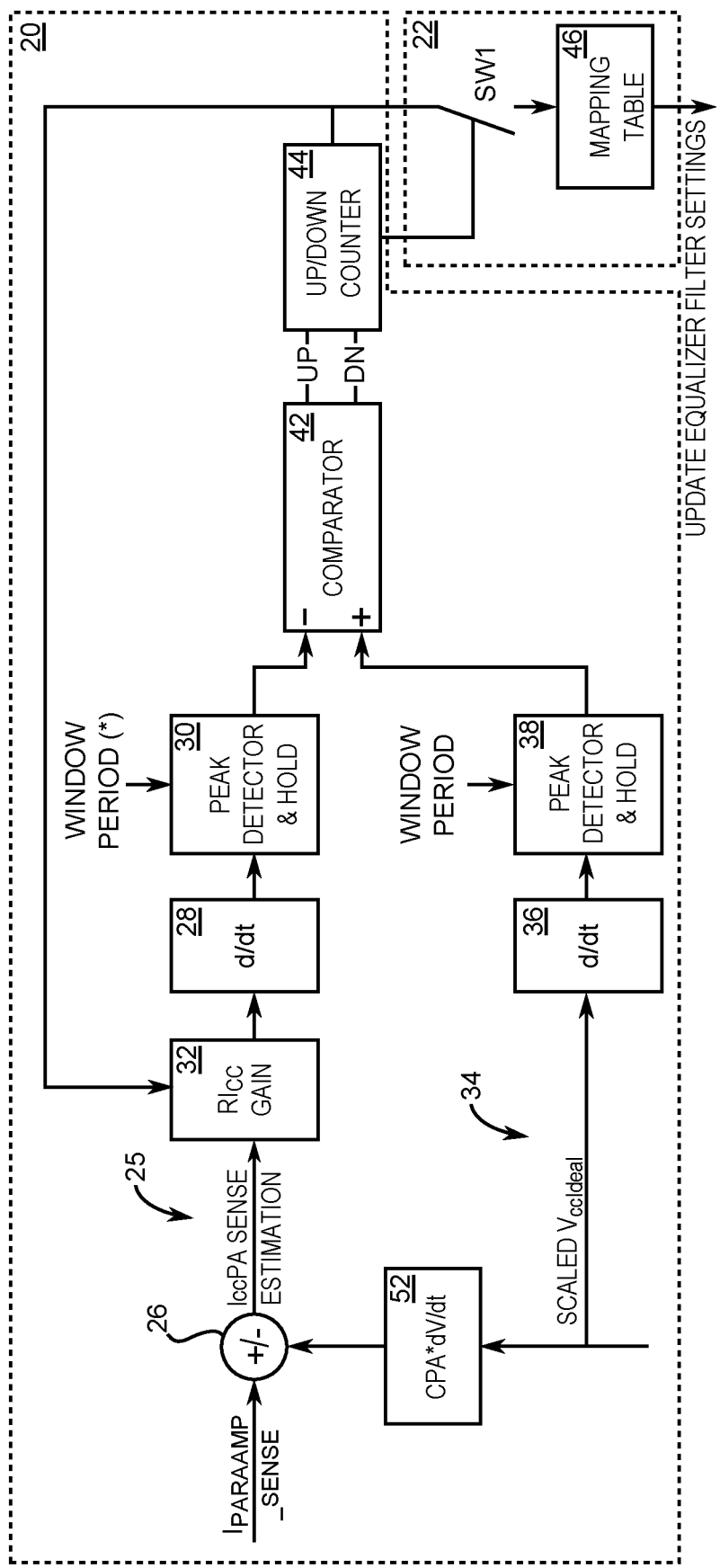
FIG. 14 is a diagram showing another embodiment in which the $RI_{CC}$ gain is applied before the peak window circuit, according to the present disclosure.

FIG. 14 is a diagram depicting another variant of the embodiment according to the present disclosure in which is shown where the $RI_{CC}$ gain circuit 32 is applied before the first peak detector circuit 30. In this particular embodiment, the first peak detector circuit 30 requires larger bandwidth while the output of the window peak has lower bandwidth.

Figure 15:
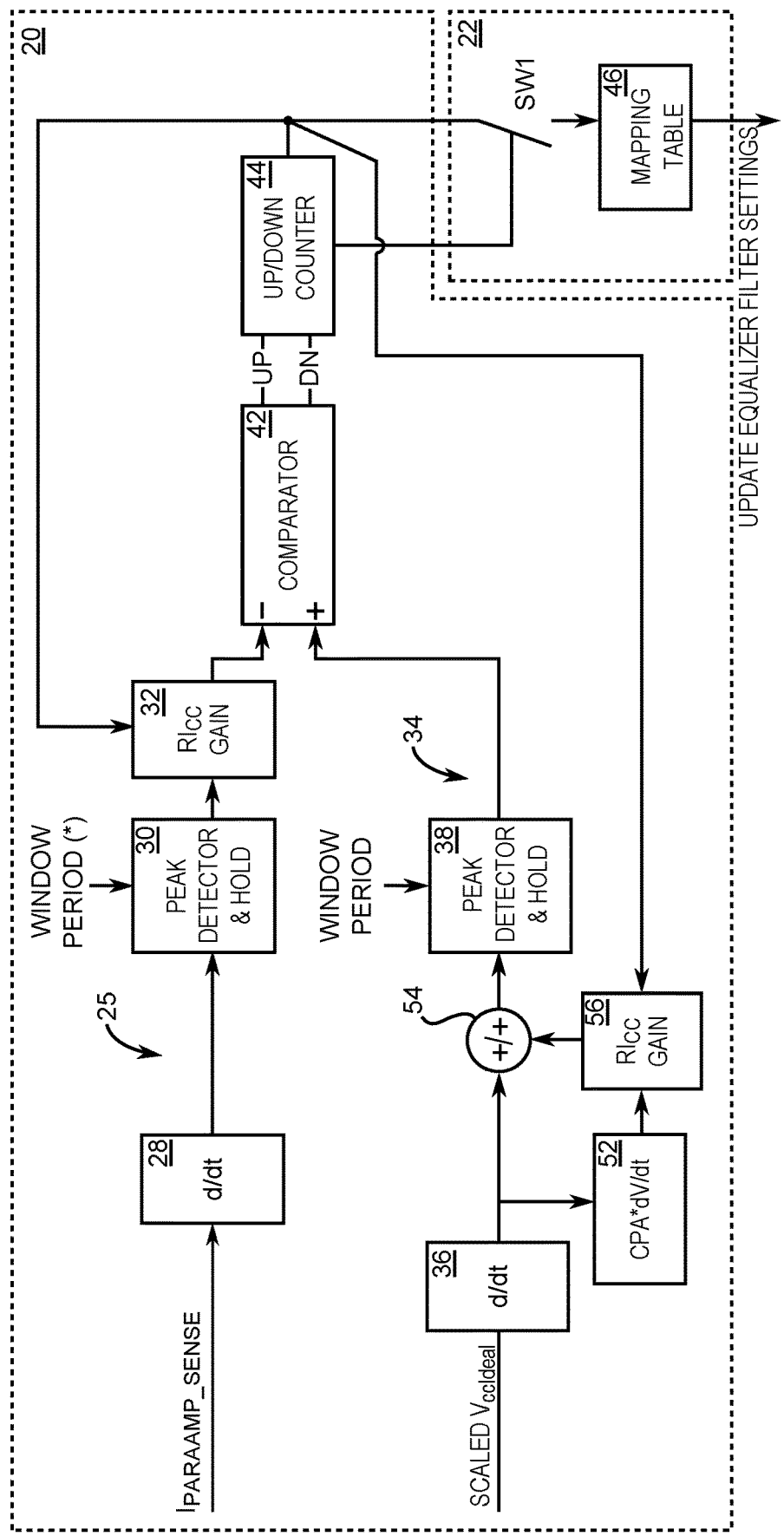
FIG. 15 is a diagram showing another embodiment that allows measurement of the load $RI_{CC}$, taking into account the shunt capacitor CPA current, according to the present disclosure.

FIG. 15 is a diagram showing another embodiment that allows measurement of the load $RI_{CC}$, taking into account the shunt capacitor CPA current, according to the present disclosure. This particular embodiment includes a summation node 54 in the second path as opposed to the difference node 26 included in the previous embodiments. Moreover, a second $RI_{CC}$ gain circuit 56 is coupled between the up/down counter 44 and the summation node 54.

FIG. 16 is a diagram showing yet another embodiment that allows measurement of the load $RI_{CC}$, taking into account the shunt capacitor CPA current and using only the second $RI_{CC}$ gain circuit 56 in the second path 34. The embodiments depicted in the diagrams of FIG. 15 and FIG. 16 address an issue in which capacitor current cannot be neglected and must be considered and where embodiments are desired that do not require knowledge of the delay and or require any delay alignment. Starting back from the equation $$\frac{I_{PARAMP}(t) - CPA * dV_{ccPA}(t)}{dt} = \frac{V_{ccPA}(t)}{RI_{CC}}$$

$$I_{PARAMP}(t) = \frac{V_{ccPA}(t)}{RI_{CC}} + \frac{CPAdV_{ccPA}(t)}{dt}$$

$$\frac{dI_{PARAMP}(t)}{dt} = \frac{\frac{dV_{ccPA}(t)}{dt}}{RI_{CC}} + \frac{CPA * d^2V_{ccPA}(t)}{dt^2},$$

it is possible that the sensed parallel amplifier current has a delay relative to the $I_{PARAMP}(t)$, or it is possible that a $V_{ccIdeal}$ signal is used instead of a $V_{ccPA}$ signal that has a difference of delay. Consequently, a method to allow the finding of $RI_{CC}$ without requiring knowledge of the delay is needed.

For example, assume again that $V_{ccPA}(t)=V_{ccIdeal}(t-\tau)$. Then, $$\frac{dI_{PARAMP}(t)}{dt} = \frac{\frac{dV_{ccIdeal}(t-\tau)}{dt}}{RI_{CC}} + \frac{CPA * d^2V_{ccIdeal}(t-\tau)}{dt^2}.$$

Since only $V_{ccideal}(t)$ and $I_{PARAMP}(t)$ are available, $dI_{PARAMP}(t)/dt$ will not be equal to $$\frac{\frac{dV_{ccIdeal}(t)}{dt}}{RI_{CC}} + \frac{CPA * d^2V_{ccIdeal}(t)}{dt^2}.$$

A maximum approach based on a given window of time applied on the derivative of the signals may be used:

$$\max(\Delta I_{PARAMP}(t_k:t_{k+1})) = \max\left(\frac{\Delta V_{ccIdeal}(t_k:t_{k+1})}{RI_{CC}} + \frac{CPA * \Delta^2 V_{ccIdeal}(t_k:t_{k+1})}{\Delta t_{k+1}}\right),$$

where $\Delta t_{k+1}=t_{k+1}-t_k$ is the window time length, which at least needs to exceed the delay $\tau$ length. This maximum equation is valid for $RI_{CC}$ extraction.

The previous equation can be multiplied by $RI_{CC}$ so that $$\max(\Delta I_{PARAMP}(t_k:t_{k+1})) * RI_{CC} = \max\left(\Delta V_{ccIdeal}(t_k:t_{k+1}) + \frac{RI_{CC} * CPA * \Delta^2 V_{ccIdeal}(t_k:t_{k+1})}{\Delta t_{k+1}}\right)$$

The first term needs to be compared with the second term to find convergence for the $RI_{CC}$ value, thus the embodiment according to the present disclosure as shown in FIG. 15.

Note that it is possible to use $V_{ccPA}$ (feedback $V_{cc}$) instead of the $V_{ccIdeal}$ signal if necessary and still have a difference in delay between $V_{ccPA}$ and the parallel amplifier sense current.

Another embodiment that uses $$\frac{1}{RI_{CC}}$$

gain scaling, as shown in FIG. 16, is based on the equation $$\max(\Delta I_{PARAMP}(t_k:t_{k+1})) = \max\left(\frac{\Delta V_{ccIdeal}(t_k:t_{k+1})}{RI_{CC}} + \frac{CPA * \Delta^2 V_{ccIdeal}(t_k:t_{k+1})}{\Delta t_{k+1}}\right).$$

Note that when the peak of slope for $V_{ccIdeal}$ or $V_{ccPA}$ (a first-order derivative) occurs, the second-order derivative of the voltage is equal to 0. This means that the CPA term effect may not be so critical in the maximum calculation.

FIGS. 17A and 17B are a simulation for a capacitor of 200 pF, using the embodiment in FIGS. 16A and 16B in which convergence and reduced sensitivity to delay between the $V_{ccIdeal}$ and the $I_{PARAMP\_SENSE}$ value are demonstrated.

It is contemplated that any of the foregoing aspects, and/or various separate aspects and features as described herein, may be combined for additional advantage. Any of the various embodiments as disclosed herein may be combined with one or more other disclosed embodiments unless indicated to the contrary herein.

Those skilled in the art will recognize improvements and modifications to the preferred embodiments of the present disclosure. All such improvements and modifications are considered within the scope of the concepts disclosed herein and the claims that follow.

What is claimed is:

1. Envelope tracking circuitry comprising:
   an envelope tracking integrated circuit (ETIC) coupled to a power supply and configured to provide an envelope tracked power signal to a power amplifier (PA);
   a filter equalizer configured to inject an error-correcting signal into the ETIC in response to equalizer settings;
   PA resistance estimator circuitry comprising:
      a first peak detector circuit configured to capture within a window first peaks associated with a sense current generated by the ETIC; and
      a second peak detector circuit configured to capture within the window second peaks associated with a scaled supply voltage corresponding to the envelope tracked power signal;
      comparator circuitry configured to receive the first peaks and receive the second peaks and generate an estimation of PA resistance; and
   an equalizer settings correction circuit configured to receive the estimation of PA resistance and update the equalizer settings in response to the estimation of PA resistance.

2. The envelope tracking circuitry of claim 1 wherein the PA resistance estimator circuitry further comprises:
   an up/down counter configured to output a count value responsive to up/down signals generated by the comparator circuitry in response to the first peaks and the second peaks captured within the window; and
   a resistance gain circuit configured to adjust a resistance value in response to the up/down signals, wherein the resistance gain circuit is further configured to provide feedback to the comparator circuitry.

3. The envelope tracking circuitry of claim 2 wherein the resistance gain circuit is within a first path that includes the first peak detector circuit.

4. The envelope tracking circuitry of claim 3 wherein the resistance gain circuit is in the first path between the first peak detector circuit and the comparator.

5. The envelope tracking circuitry of claim 3 wherein the resistance gain circuit is in the first path before the first peak detector circuit.

6. The envelope tracking circuitry of claim 3 further comprising a second resistance gain circuit in a second path that includes the second peak detector circuit, wherein the second resistance gain circuit is configured to adjust a second resistance value in response to the up/down signals, wherein the resistance gain circuit is further configured to provide feedback to the comparator circuitry.

7. The envelope tracking circuitry of claim 2 wherein a first path includes the first peak detector circuit and a second path that includes the second peak detector circuit and the resistance gain circuit.

8. The envelope tracking circuitry of claim 2 further comprising:
   a first path derivative function configured to differentiate a first signal and pass a differentiated first signal to the first peak detector circuit; and
   a second path derivative function configured to differentiate a second signal and pass a differentiated second signal to the second peak detector circuit.

9. The envelope tracking circuitry of claim 8 wherein the first path derivative function is a high-pass filter comprising a capacitor-resistor-based network.

10. The envelope tracking circuitry of claim 9 wherein the high-pass filter comprises an active component.

11. The envelope tracking circuitry of claim 8 wherein the second path derivative function is a high-pass filter comprising a capacitor-resistor-based network.

12. The envelope tracking circuitry of claim 11 wherein the high-pass filter comprises an active component.

13. The envelope tracking circuitry of claim 8 further comprising a difference node configured to receive a current sense signal and a derivative of the second signal and subtract the second signal from the current sense signal to generate a difference signal that is the first signal passed to the first path derivative function.

14. The envelope tracking circuitry of claim 13 wherein the second signal is derived from a capacitance value of the PA times a derivative of a scaled copy of voltage of the envelope tracked power signal.

15. The envelope tracking circuitry of claim 14 wherein the second path derivative function is configured to receive and differentiate the scaled copy of voltage of the envelope tracked power signal.

16. The envelope tracking circuitry of claim 14 further comprising a summation node configured to receive and add a differentiated version of the scaled copy of voltage of the envelope tracked power signal to an output of the resistance gain circuit and pass the summation to the second peak detector circuit.

17. The envelope tracking circuitry of claim 16 wherein the resistance gain circuit is further configured to adjust the resistance value in response to a second derivative of the scaled copy of voltage of the envelope tracked power signal.

18. The envelope tracking circuitry of claim 17 wherein the second derivative of the scaled copy of voltage of the envelope tracked power signal is multiplied by a capacitance value of a capacitance of the PA.

19. The envelope tracking circuitry of claim 1 wherein the equalizer settings correction circuit comprises a mapping table that is configured with a look-up table that maps equalizer settings with the estimation of PA resistance.

20. The envelope tracking circuitry of claim 19 wherein the mapping table is implemented in a digital logic circuit.

* * * * *